US012713593B2

(12) United States Patent
Lee et al.

(10) Patent No.: US 12,713,593 B2
(45) Date of Patent: Aug. 18, 2026

(54) MEMORY DEVICE MEMORY INCLUDING AN ANTIFUSE CELL ARRAY

(71) Applicant: SAMSUNG ELECTRONICS CO., LTD., Suwon-si (KR)

(72) Inventors: Changyoung Lee, Suwon-si (KR); Hyun-Chul Yoon, Suwon-si (KR); Yeongwoo Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 43 days.

(21) Appl. No.: 18/441,968

(22) Filed: Feb. 14, 2024

(65) Prior Publication Data

US 2025/0056795 A1 Feb. 13, 2025

(30) Foreign Application Priority Data

Aug. 8, 2023 (KR) ........................ 10-2023-0103603

(51) Int. Cl.

*H10B 20/25* (2023.01)
*H10B 12/00* (2023.01)
*H10B 20/00* (2023.01)
*G11C 29/04* (2006.01)

(52) U.S. Cl.

CPC ........... *H10B 20/60* (2023.02); *H10B 12/315* (2023.02); *H10B 12/33* (2023.02); *H10B 20/25* (2023.02); *G11C 29/04* (2013.01)

(58) Field of Classification Search

CPC ...................................................... H10B 20/25
See application file for complete search history.

(56) References Cited

U.S. PATENT DOCUMENTS

| | | | | |
|---|---|---|---|---|
| 7,335,943 | B2 | 2/2008 | Lojek | |
| 8,699,290 | B2 | 4/2014 | Kim | |
| 9,711,511 | B1 | 7/2017 | Lim et al. | |
| 9,917,090 | B1 | 3/2018 | Cheng et al. | |
| 9,941,009 | B2 | 4/2018 | Lim et al. | |
| 10,957,681 | B1 | 3/2021 | Fujisawa et al. | |
| 11,139,307 | B2 | 10/2021 | Cheng et al. | |
| 11,227,861 | B2 | 1/2022 | Fujisawa et al. | |
| 11,495,283 | B2 | 11/2022 | He et al. | |
| 2013/0322150 | A1* | 12/2013 | Kim ....................... | G11C 17/16 365/104 |
| 2014/0061776 | A1* | 3/2014 | Kwon .................... | H10B 43/50 257/329 |

(Continued)

FOREIGN PATENT DOCUMENTS

| | | |
|---|---|---|
| KR | 10-2013-0044655 | 5/2013 |
| KR | 10-2015-0087540 | 7/2015 |
| KR | 10-2017-0128989 | 11/2017 |

*Primary Examiner* — Hoai V Ho
(74) *Attorney, Agent, or Firm* — Fish & Richardson P.C.

(57) ABSTRACT

The present disclosure relates to memory devices. An example memory device includes a memory cell region including a memory cell array is configured to store data, and an antifuse cell array including a plurality of antifuse bit lines, a plurality of antifuse word lines, and a plurality of program transistors that is electrically coupled to a first antifuse bit line among the plurality of antifuse bit lines and that are coupled in parallel with one another. The memory device includes a peripheral circuit region including an antifuse sense amplifier is configured to output one-time programmable (OTP) data stored in the plurality of program transistors.

8 Claims, 22 Drawing Sheets

(56) References Cited

U.S. PATENT DOCUMENTS

| | | | | |
|---|---|---|---|---|
| 2015/0206595 | A1 | 7/2015 | Jeong | |
| 2021/0249422 | A1* | 8/2021 | Chang | G06F 30/392 |
| 2024/0276715 | A1* | 8/2024 | Li | H10B 20/25 |

* cited by examiner

10
CMD
ADDR
191
CONTROL LOGIC CIRCUIT
192
ADDRESS REGISTER
194
REFRESH COUNTER
REF_ADDR
ROW_ADDR
BANK_ADDR
196
RA
193
BANK CONTROL LOGIC
195
CA LATCH
COL_ADDR
220
ANTIFUSE CELL ARRAY
120
SENSE AMPLIFIER
FI
130
ROW DECODER
REPAIR UNIT
RU1
210
MEMORY CELL ARRAY
WL
BL
MC
SENSE AMPLIFIER
110
197
I/O GATING CIRCUIT
DQ
140
COLUMN DECODER
REPAIR UNIT
RU2
198
DATA I/O BUFFER
DQ

220a
Fuse_nma
Fuse_00a
aBL<m>
aBL<2>
aBL<1>
aBL<0>
aBL
WLP<0>
WLR<0>
WLP<1>
WLR<1>
WLP<n>
WLR<n>
aWL 210_1
210_2
210_3
210_4
210
220_1
220_2
220_3
220_4
220
210D
SUB MEMORY ARRAY
A
SUB ANTI FUSE ARRAY
B
CS
D1
D2
D3

10a
MC
219
218
217
Cap
216
214
213
212
BL
SUB2
215
211g
211bg
211
CH
A
D1
D2
D3
228
227
225
226
224
223
222
CHr(RTr)
aBL
Fuse
221gr
221bg
221gp
221
CHp(PTr)
d
B 10a
CS
PS
I
II
Cap
SUB2
BL
211
CH
215
217
218
219
MC
283c
183c
SUB1
203
103
MCBA
282c
281c
270c
260c
170c
160c
150c
110
182c
181c
AFBA
227
225
221
CHr
CHp
270b
aBL
Fuse
183b
283b
170b
160b
150b
120
182b
181b
PA
260b
281b
282b
104
107
108
150a
105
202
282a
182a
181a
102
170a
160a
D3
D2
D1

RTr { RTr1, RTr2, ⋮, RTrx }

PTr { PTr1, PTr2, ⋮, PTrx }

RTr { RTr1, RTr2, ⋮, RTrx }

PTr { PTr1, PTr2, ⋮, PTrx }

220d
Fuse_00d
Fuse_mm-2d
WLP<0>
WLR<0>
WLP<1>
WLR<1>
WLP<n>
WLR<n>
aWL
aBL<0>
aBL<1>
aBL<2>
aBL<m-2>
aBL<m-1>
aBL<m>
aBL

MEMORY DEVICE MEMORY INCLUDING AN ANTIFUSE CELL ARRAY

CROSS-REFERENCE TO RELATED APPLICATION

This application claims priority to and the benefit of Korean Patent Application No. 10-2023-0103603 filed in the Korean Intellectual Property Office on Aug. 8, 2023, the entire contents of which are incorporated herein by reference.

BACKGROUND

Volatile memories generally cannot store data when they are powered off. For this reason, in some areas of volatile memory devices, one-time programmable (OTP) elements may be disposed. By performing e-fusing and anti-fusing operations on the OTP elements, information required to be essentially stored is stored as fuse information in the OTP elements.

A method of disposing an antifuse cell array in a memory device in view of a manufacturing method, the degree of integration, etc., and storing fuse information in an anti-fusing manner using the oxide breakdown characteristic of the antifuse cells is being used.

SUMMARY

The present disclosure relates to memory devices, including a memory device which can store more fuse information and in which an antifuse cell array occupies a small area, a memory device having a smaller chip size, a memory device with improved reliability of operations on antifuse cells, and a memory device with improved the speed of operations on antifuse cells.

In some implementations, a memory device includes a memory cell region including a memory cell array that is configured to store data and an antifuse cell array that includes an antifuse cell, and a peripheral circuit region that includes at least a portion overlapping the memory cell region in a planar manner, and includes an antifuse sense amplifier that is configured to one-time programmable (OTP) data stored in the antifuse cell.

In some implementations, a memory device includes a memory cell region including a memory cell array is configured to data, and an antifuse cell array including a plurality of antifuse bit lines, a plurality of antifuse word lines, and a plurality of program transistors that are electrically coupled to a first antifuse bit line among the plurality of antifuse bit lines and that are coupled in parallel with one another, and a peripheral circuit region including an antifuse sense amplifier is configured to one-time programmable (OTP) data stored in the plurality of program transistors.

In some implementations, a memory device includes a memory cell region including a plurality of bit lines, a plurality of word lines and an antifuse cell array, a memory cell array including a memory vertical-channel layer that extends perpendicular to a direction in which the plurality of word lines extends on upper surfaces of the plurality of bit lines, and the antifuse cell array including an antifuse cell, and a peripheral circuit region that includes at least a portion overlapping the memory cell region in a planar manner, and includes an antifuse sense amplifier that is configured to output one-time programmable (OTP) data stored in the antifuse cell.

In some implementations, a memory device includes a memory cell region including a memory cell array that is configured to store data and an antifuse cell array that does not overlap the memory cell array in a planar manner, the antifuse cell array including an antifuse cell, a peripheral circuit region including an antifuse sense amplifier is configured to output one-time programmable (OTP) data stored in the antifuse cell and a contact plug that extends from an external pad which is disposed on an upper surface of the memory cell region, passes through at least a portion of the memory cell region, and is electrically coupled to a circuit element of the peripheral circuit region.

DETAILED DESCRIPTION

Figure 1:
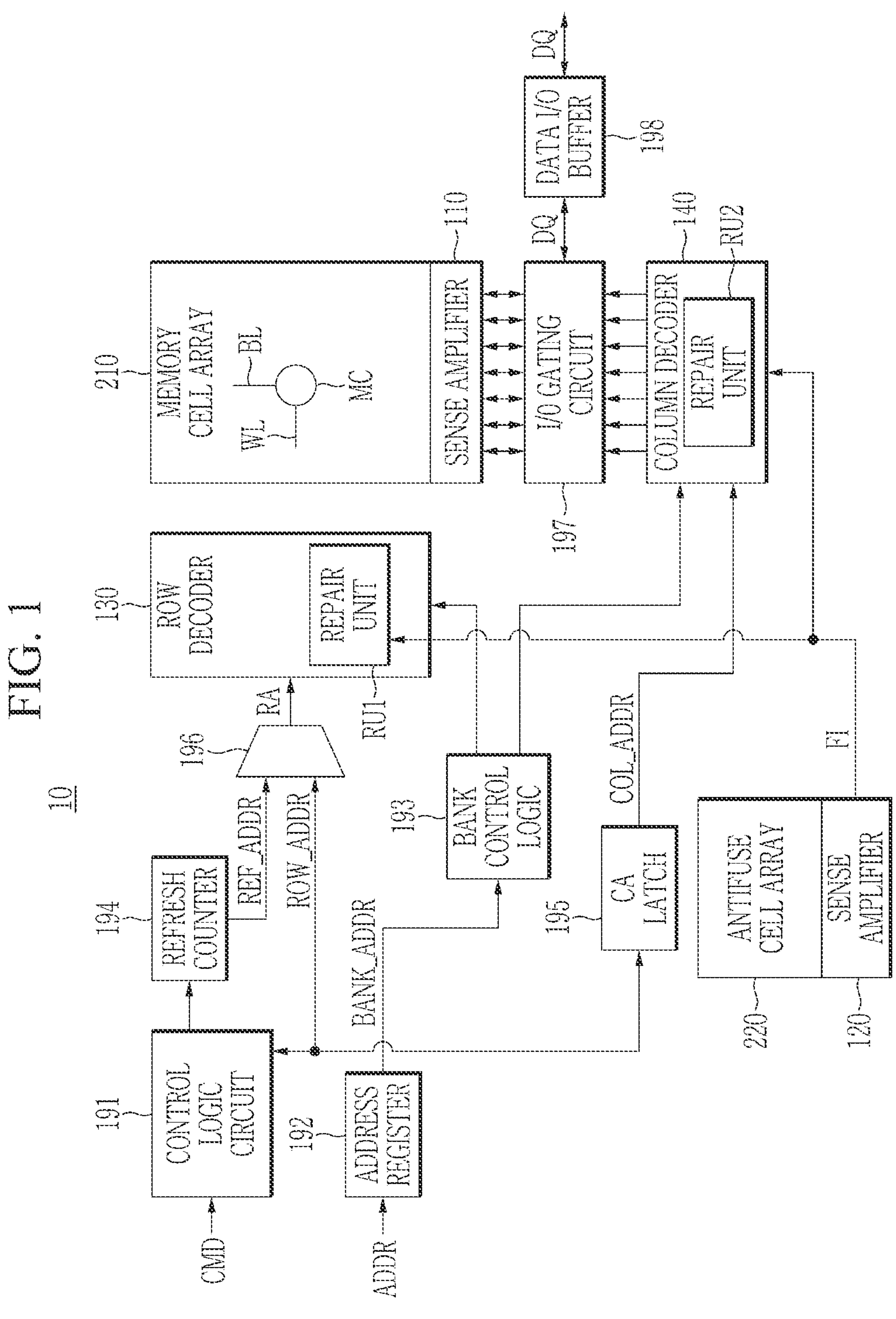
FIG. 1 is a block diagram illustrating the configuration of an example of a memory device.

In the following detailed description, only certain implementations of the present disclosure have been shown and described, by way of illustration. The present disclosure can be variously implemented and is not limited to the following implementations.

The drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present disclosure is not limited thereto. In the drawings, the thicknesses of layers, films, panels, regions, etc., are exaggerated for clarity. Further, in the drawings, for understanding and ease of description, the thickness of some layers and areas is exaggerated.

In addition, unless explicitly described to the contrary, the word "comprise", and variations such as "comprises" or "comprising", will be understood to imply the inclusion of stated elements but not the exclusion of any other elements.

FIG. 1 is a block diagram illustrating the configuration of an example of a memory device.

A memory device 10 may include a memory cell array 210, an antifuse cell array 220, a sense amplifier 110, an antifuse sense amplifier 120, a row decoder 130, a column decoder 140, a control logic circuit 191, an address register 192, a bank control logic 193, a refresh counter 194, a column address latch 195, a row address multiplexer 196, an I/O gating circuit 197, and a data I/O buffer 198.

The memory cell array 210 may include a predetermined number of memory banks including memory channels. In some implementations, the memory banks may include a plurality of sub memory cell arrays 210_1 to 210_4 shown in FIG. 5.

Further, in some implementations, the sense amplifier 110, the row decoder 130, and the column decoder 140 may include a plurality of bank sense amplifiers, a plurality of bank row decoders, and a plurality of bank column decoders coupled to the memory banks, respectively; however, they are not limited thereto.

The memory cell array 210 may include a plurality of word lines WL, a plurality of bit lines BL, and a plurality of memory cells MC positioned at the intersections of the word lines WL and the bit lines BL. The memory device 10 may perform operations of reading or writing data DQ on the plurality of memory cells MC.

Figure 6:
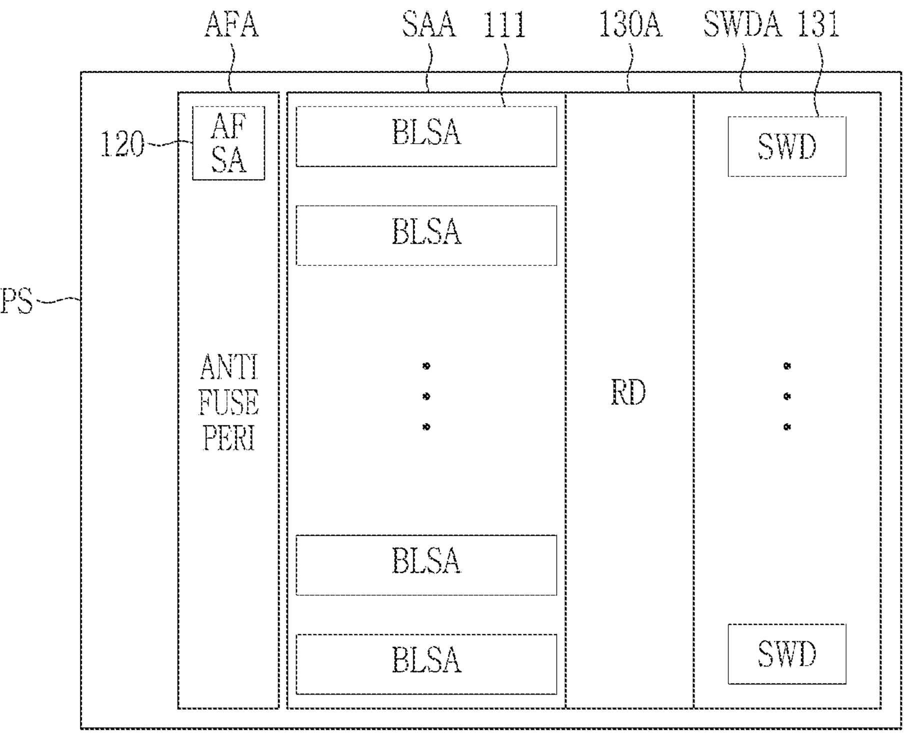
FIG. 6 is a plan view illustrating an example of a peripheral circuit region.
Figure 6:
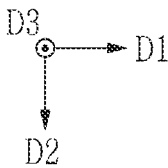

The sense amplifier 110 may include a plurality of bit-line sense amplifiers coupled to the plurality of bit lines BL of the memory cell array 210. The plurality of bit-line sense amplifiers may detect data which are input or output through the bit lines BL, and input or output the detected data. In some implementations, the plurality of bit-line sense amplifiers may be bit-line sense amplifiers 111 in FIG. 6, and a description of an arrangement of the plurality of bit-line sense amplifiers will be made below when FIG. 6 is described.

The control logic circuit 191 may control the operation of the memory device 10. For example, the control logic circuit 191 may generate control signals such that the memory device 10 performs writing operations or read operations. Although not shown in the drawings, the control logic circuit 191 may include a command decoder for decoding commands CMD which are received, and a mode register for setting an operation mode for the memory device 10.

The address register 192 may receive an address ADDR including a bank address BANK_ADDR, a row address ROW_ADDR, and a column address COL_ADDR, from a memory controller. The address register 192 may provide the received bank address BANK_ADDR to the bank control logic 193, and provide the received row address ROW_ADDR to the row address multiplexer 196.

The bank control logic 193 may generate bank control signals in response to the bank address BANK_ADDR. In response to the bank control signals, the row decoder 130 and the column decoder 140 may activate a corresponding bank.

The row address multiplexer 196 may receive the row address ROW_ADDR from the address register 192, and receive a refresh row address REF_ADDR from the control logic circuit 191. The row address multiplexer 196 may selectively output the row address ROW_ADDR or the refresh row address REF_ADDR as a row address RA. The row address RA output from the row address multiplexer 196 may be applied to the row decoder 130.

The row decoder 130 may decode the row address RA output from the row address multiplexer 196, thereby activating a word line corresponding to the row address RA. For example, the row decoder 130 may include a plurality of word line drivers for applying word line drive voltage to word lines corresponding to row addresses RA. In some implementations, the plurality of word line drivers may include sub word line drivers 131 in FIG. 6, and a description of an arrangement of the plurality of word line drivers will be made below when FIG. 6 is described.

Also, the row decoder 130 may include a first repair unit RU1. The first repair unit RU1 may receive fuse information FI from the antifuse cell array 220, and perform a repair operation on defective cells on the basis of the fuse information FI. After the repair operation, when a row address RA related to defective cells is input, the first repair unit RU1 activates a redundancy decoder in the row decoder 130. The activated redundancy decoder may disable the decoder related to defective cells, such that the defective cells are replaced with redundancy cells in a redundancy memory cell array. Fuse information FI may include address information on defective cells in the memory cell array 210. In some implementations, the redundancy decoder may be implemented as a separate external device.

The column address latch 195 may receive a column address COL_ADDR from the address register 192, and temporally store the received column address COL_ADDR. Also, the column address latch 195 may gradually increase the received column address COL_ADDR in a burst mode. The column address latch 195 may apply the temporally stored or gradually increased column address to the column decoder 140.

In relation to the bank which is activated by the bank control logic 193, the column decoder 140 may activate a bit-line sense amplifier in the sense amplifier 110, corresponding to the bank address BANK_ADDR and the column address COL_ADDR, through the I/O gating circuit 197.

Further, the column decoder 140 may include a second repair unit RU2. The second repair unit RU2 may receive fuse information FI from the antifuse cell array 220, and perform a repair operation on defective cells on the basis of the fuse information FI. After the repair operation, when a column address COL_ADDR related to defective cells is input, the second repair unit RU2 activates a redundancy decoder in the column decoder 140. The activated redundancy decoder may disable the decoder related to defective cells, such that the defective cells are replaced with redundancy cells in a redundancy memory cell array. In some implementations, the redundancy decoder may be implemented as a separate external device.

The I/O gating circuit 197 may include a circuit that gates I/O data, an input data mask logic, data latches that stores data output from the memory cell array 210, and write drivers that write data in the memory cell array 210.

The data I/O buffer 198 may provide data DQ to the I/O gating circuit 197 on the basis of a clock signal during a writing operation. The data I/O buffer 198 may provide data DQ to a memory controller on the basis of the clock signal during a read operation.

The antifuse sense amplifier 120 may detect fuse information FI stored in the antifuse cell array 220, and output them. In the drawings, fuse information FI look like being input only to the row decoder 130 and the column decoder 140; however, fuse information may be provided to components in the memory device 10 requiring option signals for adjusting parameters (such as reference voltage, reference current, etc.).

In some implementations, the antifuse sense amplifier 120 may include a plurality of antifuse sense amplifiers and a majority voting circuit; however, it is not limited thereto. Any one of the plurality of antifuse sense amplifiers may be a 0-th antifuse sense amplifier 121_0*a* in FIG. 3. The plurality of antifuse sense amplifiers may be included in the antifuse sense amplifier 120 in FIG. 6.

Figure 2:
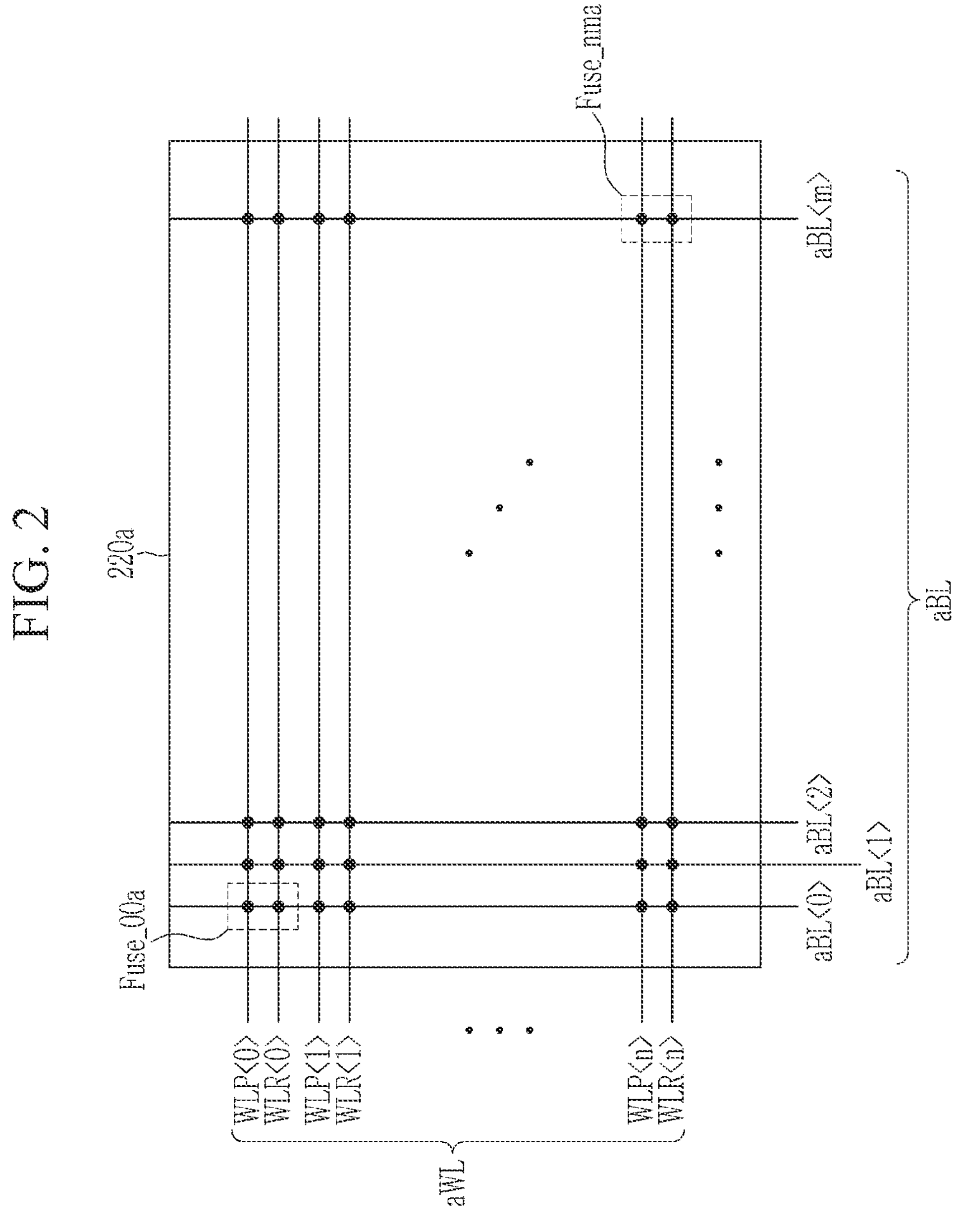
FIG. 2 is a view for explaining an example of an antifuse cell array.
Figure 3:
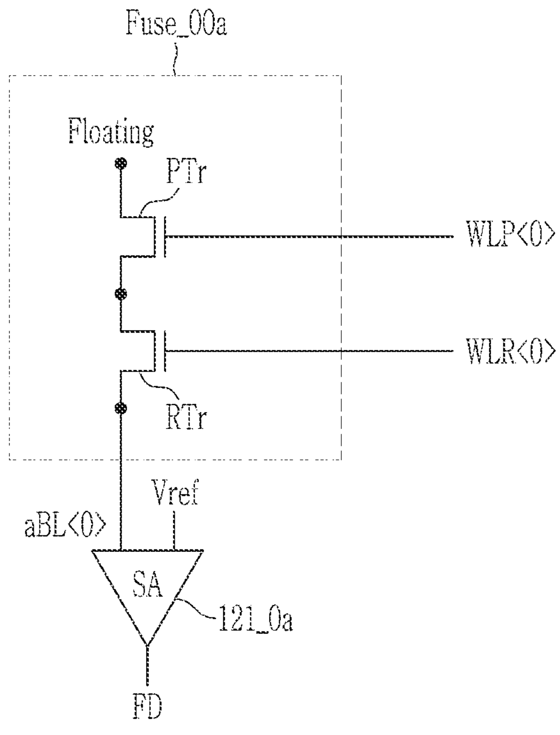
FIG. 3 is a circuit diagram illustrating an example of an antifuse cell.

A detailed description of the antifuse cell array 220 and the antifuse sense amplifier 120 will be made below when FIG. 2 and FIG. 3 are described.

FIG. 2 is a view for explaining an example of an antifuse cell array. FIG. 3 is a circuit diagram illustrating an example of an antifuse cell.

Referring to FIG. 1 to FIG. 3, an antifuse cell array 220*a* may include a plurality of antifuse cells Fuse_00*a* to Fuse_nma arranged (n+1) number of rows and (m+1) number of columns, a plurality of antifuse word lines aWL, and a plurality of antifuse bit lines aBL.

The plurality of antifuse cells Fuse_00*a* to Fuse_nma may be arranged in a matrix form relative to the plurality of antifuse word lines aWL and the plurality of antifuse bit lines aBL. The plurality of antifuse word lines aWL may include a plurality of program word lines WLP<0> to WLP<n> and a plurality of read word lines WLR<0> to WLR<n>. In some implementations, the plurality of program word lines WLP<0> to WLP<n> and the plurality of read word lines WLR<0> to WLR<n> may be alternately arranged. For example, the plurality of program word lines WLP<0> to WLP<n> and the plurality of read word lines WLR<0> to WLR<n> may be arranged in the order of one program word line, one read word line, one program word line, one read word line, etc.

In some implementations, of the plurality of antifuse word lines aWL, a pair of program word line and read word line that are adjacent to each other and are activated together may be one row, and of the plurality of antifuse bit lines aBL, one antifuse bit line may correspond to one column.

Of the plurality of antifuse cells Fuse_00*a* to Fuse_nma, antifuse cells arranged in the same column may share one of the plurality of antifuse bit lines aBL with one another.

Hereinafter, since the plurality of antifuse cells Fuse_00*a* to Fuse_nma has the same configuration, a specific description of the plurality of antifuse cells Fuse_00*a* to Fuse_nma may be replaced by a description of the (0, 0)-th antifuse cell Fuse_00*a*.

The (0, 0)-th antifuse cell Fuse_00*a* may store 1-bit data of 0 or 1. In other words, in the present disclosure, one antifuse cell may store 1-bit fuse data FD. Fuse information FI in FIG. 1 may include fuse data FD stored in the plurality of antifuse cells Fuse_00*a* to Fuse_nma. In the present disclosure, fuse data FD may be stored in the e-fusing or anti-fusing manner on OTP (one-time programmable) elements. Further, the fuse data FD may be OTP data programmable one time.

The (0, 0)-th antifuse cell Fuse_00*a* may be coupled to the 0-th antifuse sense amplifier 121_0*a* through the 0-th antifuse bit line aBL<0>. The 0-th antifuse sense amplifier 121_0*a* may receive an electrical signal from the (0, 0)-th antifuse cell Fuse_00*a* through the 0-th antifuse bit line aBL<0>. The 0-th antifuse sense amplifier 121_0*a* may generate a voltage based on the received electrical signal, and compare the generated voltage and a reference voltage Vref, thereby detecting and outputting fuse data FD.

The (0, 0)-th antifuse cell Fuse_00*a* includes a read transistor RTr and a program transistor PTr. The gate terminal of the read transistor RTr may be coupled to the 0-th read word line WLR<0>, and the gate terminal of the program transistor PTr may be coupled to the 0-th program word line WLP<0>. The read transistor RTr may be operated by the 0-th read word line WLR<0>, and the program transistor PTr may be operated by the 0-th program word line WLP<0>.

Another terminal of the read transistor RTr may be coupled to the 0-th antifuse bit line aBL<0>, and the other terminal of the read transistor RTr may be coupled to another terminal of the program transistor PTr. For example, the source terminal of the read transistor RTr may be coupled to the 0-th antifuse bit line aBL<0>, and the drain terminal of the read transistor RTr may be coupled to the source terminal of the program transistor PTr.

Another terminal of the program transistor PTr may be coupled to the read transistor RTr such that the program transistor PTr is electrically coupled to the 0-th antifuse bit line aBL<0> through the read transistor RTr. The other terminal of the program transistor PTr may be floated. For example, the source terminal of the program transistor PTr may be coupled to the 0-th antifuse bit line aBL<0>, and the drain terminal of the program transistor PTr may be floated. Since the drain terminal of the program transistor PTr is floated, the program transistor PTr can function as a two-terminal element having a gate terminal and a source terminal. In other words, in the present disclosure, the read transistor RTr and the program transistor PTr may be coupled in series.

When a programming or rupturing operation is performed on the program transistor PTr, a breakdown voltage may be applied to the program transistor PTr by the 0-th program word line WLP<0>. The breakdown voltage may be in a range from about 5 V to about 8 V. As an example, the breakdown voltage may be in a range from about 5.5 V to about 6 V. For example, the breakdown voltage may be 5.5 V at the beginning of a programming operation on the program transistor PTr, but may gradually rise to a voltage level of 6 V or higher over time.

The program transistor PTr is a device which is open before rupturing such that current does not flow between two terminals and in which the source terminal (or both of the source terminal and the drain terminal) is short-circuited with the gate terminal after rupturing such that current can flow. In other words, the program transistor PTr may be a device that has a resistance value close to infinity before rupturing and has a predetermined resistance value after rupturing.

Before a rupturing operation, when a read voltage is applied to the 0-th program word line WLP<0> to perform a read operation on the program transistor PTr, between the gate terminal and source terminal of the program transistor PTr, current may not flow, or off current at a level of leakage current may flow. After the rupturing operation, the read transistor RTr and the program transistor PTr may be coupled in series between the 0-th antifuse bit line aBL<0> and the 0-th program word line WLP<0>. After the rupturing operation, when the read operation is performed on the program transistor PTr by the 0-th program word line WLP<0>, between the gate terminal and source terminal of the program transistor PTr, program current of a predetermined magnitude may flow. In some implementations, the read voltage may be in a range from about 2 V to about 4 V, lower than the breakdown voltage. As an example, the read voltage may be about 3 V.

Depending on whether program current of the predetermined magnitude flows in the program transistor PTr, it may be determined whether the program transistor PTr has been programmed (ruptured). Using this, fuse data FD of 0 or 1 may be stored or programmed in the program transistor PTr. Since the program transistor PTr cannot be restored to the state before the rupturing, it may be an OTP element which can be programmed only once.

The read transistor RTr may be operated by the 0-th read word line WLR<0>, and when the read transistor RTr is turned on, the 0-th program word line WLP<0> and the 0-th antifuse bit line aBL<0> may be electrically coupled. During a read operation, the program transistor PTr may operate as a resistor, thereby providing a current signal corresponding to program current to the 0-th antifuse sense amplifier 121_0*a*.

Figure 7:
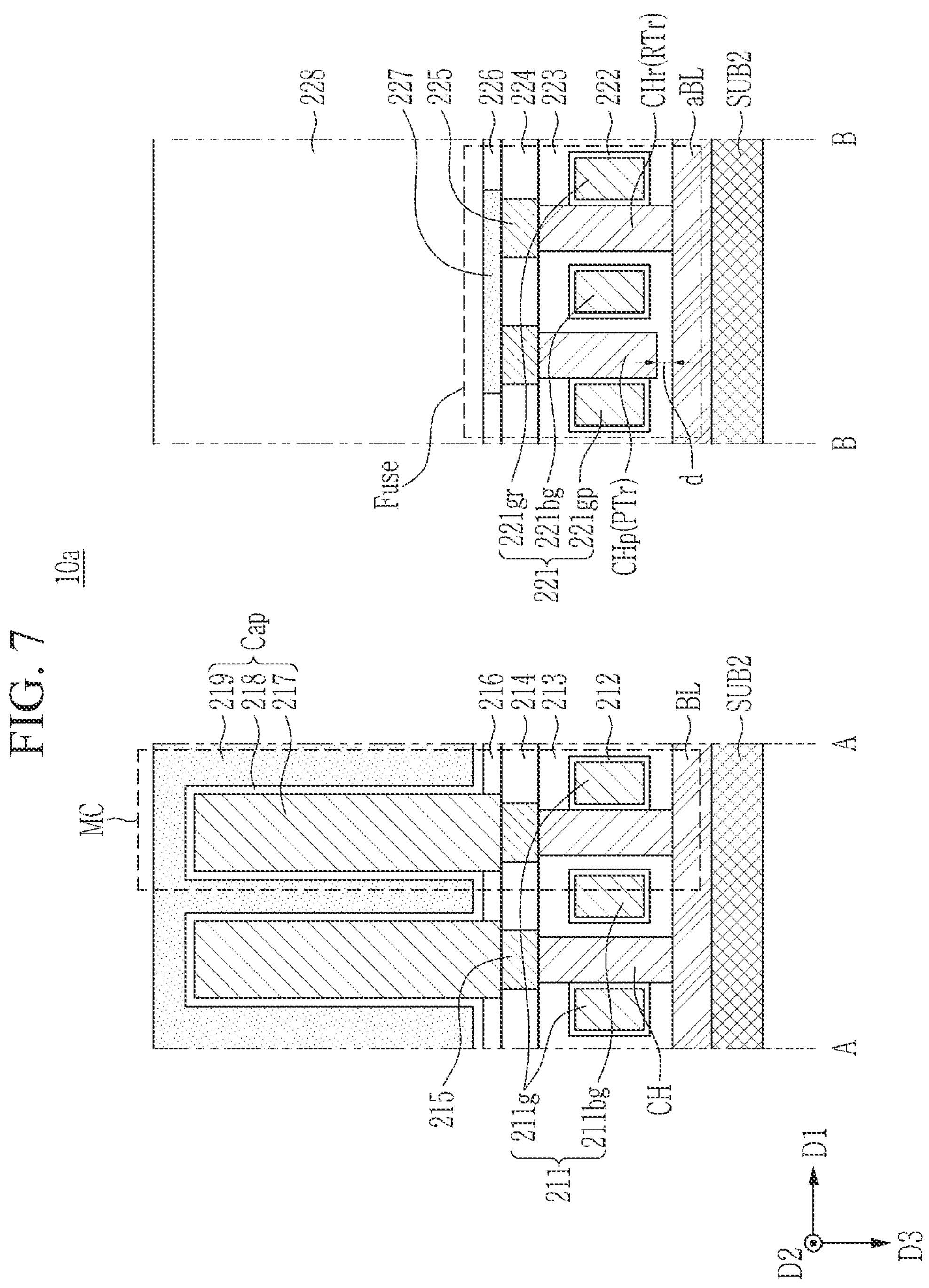
FIG. 7 is example cross-sectional views taken along line A-A and line B-B in FIG. 5.
Figure 8:
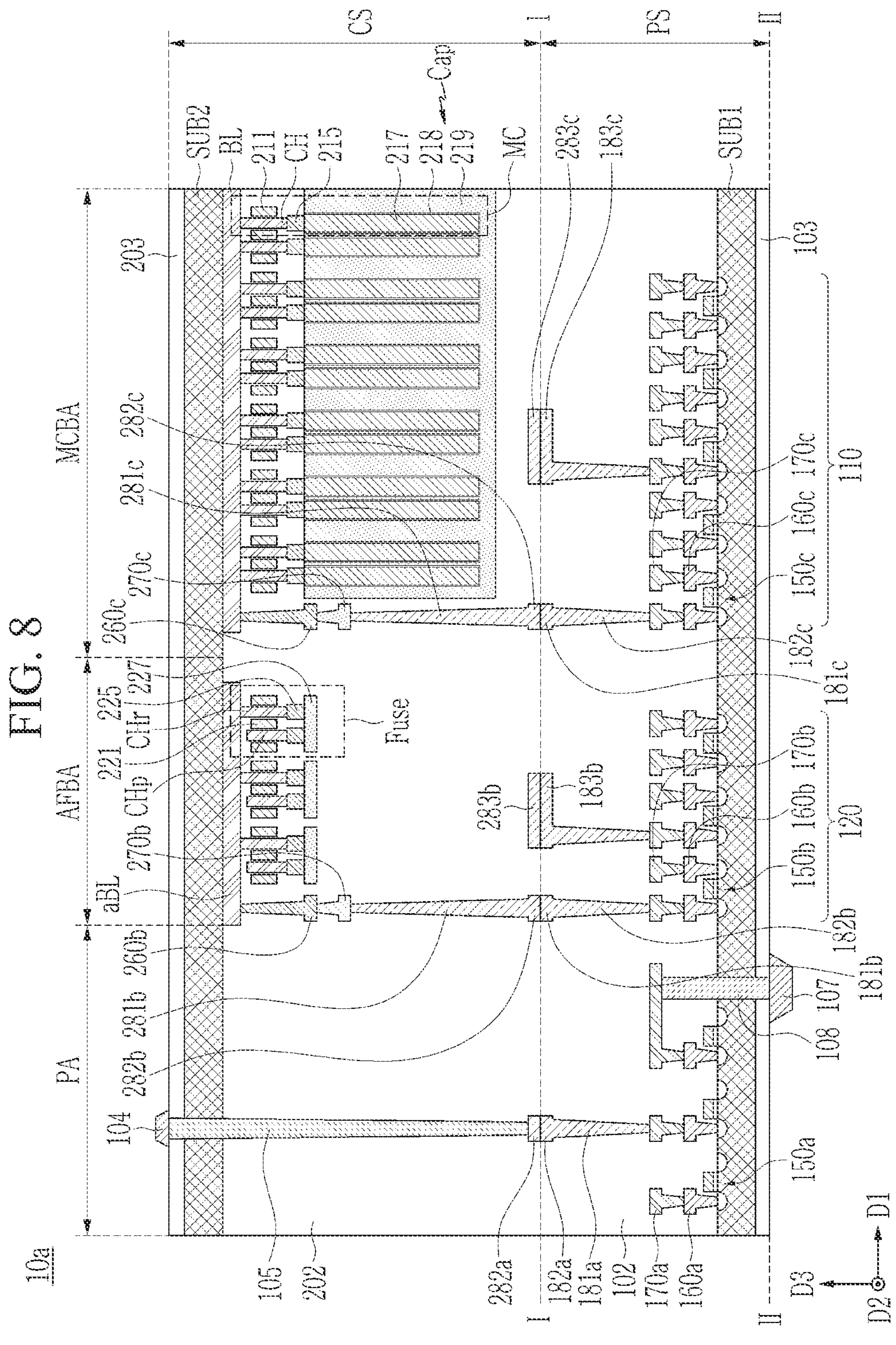
FIG. 8 is an example cross-sectional view taken along line C-C' in FIG. 4.

A description of the structures of the read transistor RTr and the program transistor PTr will be made below when FIG. 7 and FIG. 8 are described.

Hereinafter, an arrangement of constituent elements in the memory device will be described with reference to FIG. 4 to FIG. 6.

Figure 4:
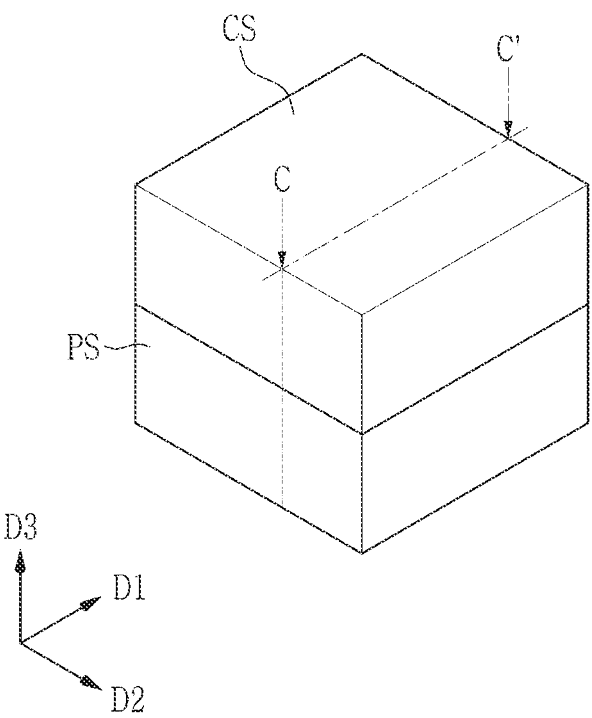
FIG. 4 is an example perspective view illustrating the memory device.
Figure 5:
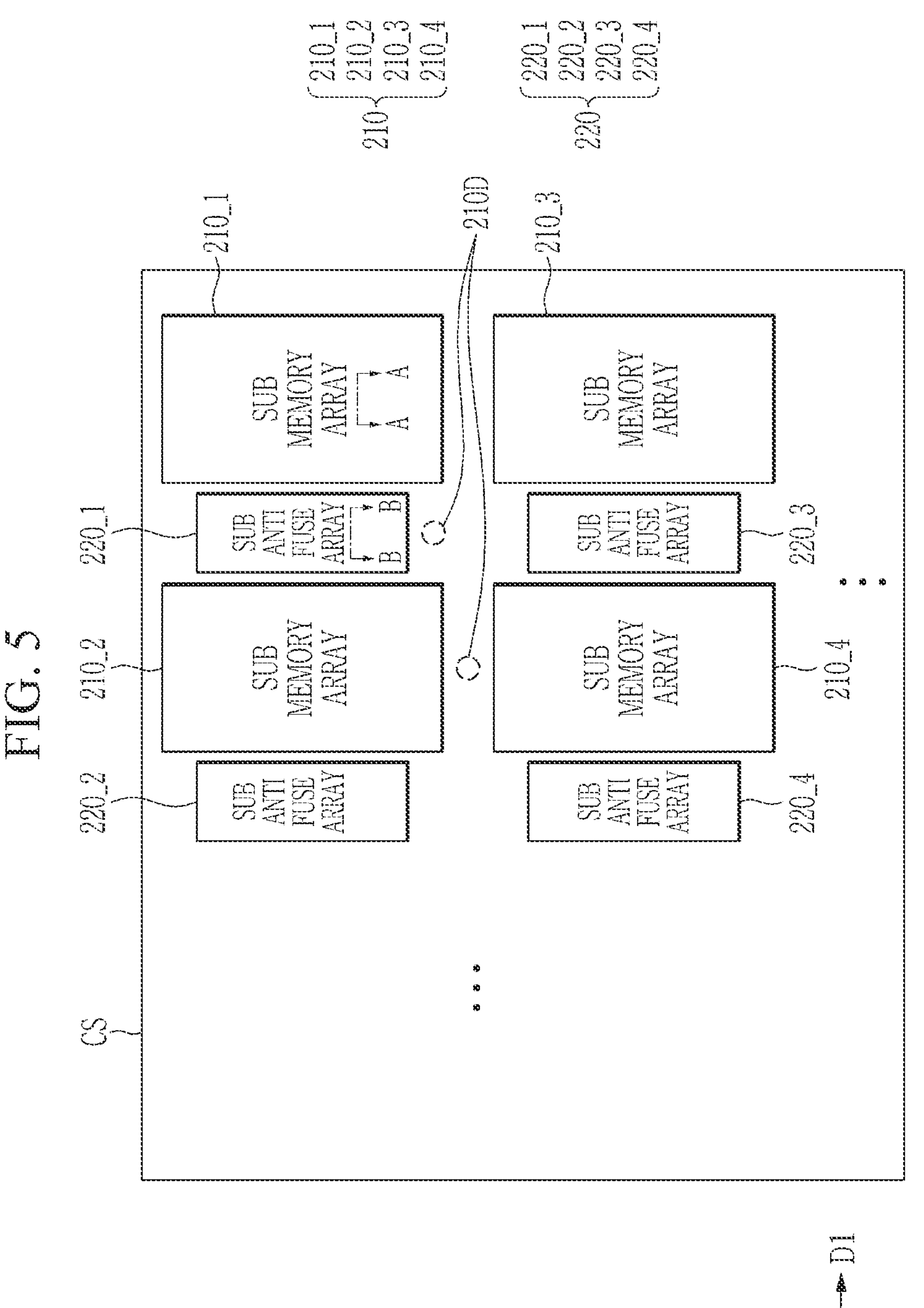
FIG. 5 is a plan view illustrating an example of a memory cell region.

FIG. 4 is an example perspective view of a memory device, and FIG. 5 is a plan view of an example of a memory cell region, and FIG. 6 is a plan view of an example of a peripheral circuit region.

Referring to FIG. 4 to FIG. 6, a memory device 10 may include a peripheral circuit region PS and a memory cell region CS. The memory device 10 may have a COP Cell on Peri structure, and the peripheral circuit region PS and the memory cell region CS may be stacked three-dimensionally in a third direction D3.

At least a portion of the peripheral circuit region PS may overlap the memory cell region CS plane-wise along the third direction D3. In some implementations, the peripheral circuit region PS may include some of external pads or wiring members which are disposed on the memory cell region CS.

The memory cell region CS may include a memory cell array 210 and an antifuse cell array 220. The memory cell array 210 and the antifuse cell array 220 may be disposed so as not to overlap each other plane-wise along the third direction D3. In some implementations, the memory cell array 210 and the antifuse cell array 220 may be disposed in the same plane.

The memory cell array 210 may include a plurality of sub memory cell arrays 210_1 to 210_4. The plurality of sub memory cell arrays 210_1 to 210_4 may be disposed so as to be spaced apart from one another in a first direction D1 and a second direction D2. The plurality of sub memory cell arrays 210_1 to 210_4 is disposed so as not to overlap one another plane-wise along the third direction D3. In some implementations, middle regions 210D may be located between the plurality of sub memory cell arrays 210_1 to 210_4, such that the plurality of sub memory cell arrays 210_1 to 210_4 are spaced apart from one another around the middle regions 210D.

The antifuse cell array 220 may be the antifuse cell array 220 in FIG. 2. The antifuse cell array 220 may include a plurality of sub antifuse cell arrays 220_1 to 220_4. The plurality of sub antifuse cell arrays 220_1 to 220_4 may be disposed in the middle regions 210D which are regions between the plurality of sub memory cell arrays 210_1 to 210_4. In some implementations, the plurality of sub antifuse cell arrays 220_1 to 220_4 may be disposed so as to be aligned in the first direction D1 and the second direction D2. The plurality of sub antifuse cell arrays 220_1 to 220_4 is disposed so as not to overlap one another plane-wise along the third direction D3.

In the drawing, it is shown that each of the number of sub memory cell arrays 210_1 to 210_4 and the number of sub antifuse cell arrays 220_1 to 220_4 is four; however, this is merely an example, and the technical idea of the present disclosure is not limited to the numbers of sub memory cell arrays and sub antifuse cell arrays.

The peripheral circuit region PS may include a sub word line driver area SWDA, a row decoder area 130A, a sense amplifier area SAA, and an antifuse peripheral-circuit area AFA.

In the sub word line driver area SWDA, a plurality of sub word line drivers 131 may be disposed. The plurality of sub word line drivers 131 may be word line drivers which are included in the row decoder 130 in FIG. 1.

The sub word line drivers 131 may be coupled to the word lines disposed in the plurality of sub memory cell arrays 210_1 to 210_4, and may activate the coupled word lines to drive the plurality of sub memory cell arrays 210_1 to 210_4. In FIG. 6, the plurality of sub word line drivers 131 is shown as being arranged in a line along the second direction D2; however, the arrangement of the plurality of sub word line drivers 131 in FIG. 6 is merely an example, and the technical idea of the present disclosure is not limited to the above-mentioned arrangement example.

In the row decoder area 130A, some circuits of the components of the row decoder 130 in FIG. 1 may be disposed. The circuits in the row decoder area 130A may be electrically coupled to the plurality of sub word line drivers 131 or the word lines in the plurality of sub memory cell arrays 210_1 to 210_4.

The sense amplifier area SAA may include a plurality of bit-line sense amplifiers 111. The plurality of bit-line sense amplifiers 111 may be coupled to bit lines and complementary bit lines that are coupled to the plurality of sub memory cell arrays 210_1 to 210_4, so as to be able to detect and amplify data which is input to or output from the plurality of sub memory cell arrays 210_1 to 210_4 through the bit lines and the complementary bit lines coupled thereto. In FIG. 6, the plurality of bit-line sense amplifiers 111 is shown as being arranged in a line along the second direction D2; however, the arrangement of the plurality of bit-line sense amplifiers 111 in FIG. 6 is merely an example, and the technical idea of the present disclosure is not limited to the above-mentioned arrangement example.

Although not shown in the drawing, in the sense amplifier area SAA, besides the plurality of bit-line sense amplifiers 111, data sense amplifiers, write driver circuits, and so on may be disposed.

In the antifuse peripheral-circuit area AFA, an antifuse sense amplifier 120 may be disposed. The antifuse sense amplifier 120 may be the antifuse sense amplifier 120 in FIG. 1, and may include a plurality of antifuse sense amplifiers that is coupled to antifuse bit lines. In some implementations, the antifuse sense amplifier 120 may include a majority voting circuit. Although not shown in the drawings, in the antifuse peripheral-circuit area AFA, antifuse word line drivers, multiplexers for selecting antifuse bit lines, and so on may be disposed.

In FIG. 6, the sub word line driver area SWDA, the row decoder area 130A, the sense amplifier area SAA, and the antifuse peripheral-circuit area AFA extend along the second direction D2, and are spaced apart in the first direction D1. The arrangement of the components in the peripheral circuit region PS in FIG. 6 is merely an example, and the above-mentioned arrangement example does not limit the technical idea of the present disclosure.

The antifuse cell array 220 of this disclosure may not be disposed in the peripheral circuit region PS, and may be disposed in at least one of the middle regions 210D between the plurality of sub memory cell arrays 210_1 to 210_4. Through this arrangement of the antifuse cell array 220, the area of the peripheral circuit region PS can be reduced, and the chip size overhead of the overall memory device 10 can be reduced. Also, in a COP structure, the middle regions 210D between the plurality of sub memory cell arrays 210_1 to 210_4 may have sufficient areas, and the antifuse cell array 220 may be disposed in a middle region 210D. Through the above-mentioned arrangement of the antifuse cell array 220, it is possible to improve the operation performance of the antifuse cells in the antifuse cell array 220.

FIG. 7 is example cross-sectional views taken along line A-A and line B-B in FIG. 5. FIG. 8 is an example cross-sectional view taken along line C-C' in FIG. 4.

Referring to FIG. 4, FIG. 5, FIG. 7, and FIG. 8, the memory cell array 210 may include a second substrate SUB2, bit lines BL, memory vertical-channel layers CH, a plurality of first gate electrodes 211, first gate insulating layers 212, and capacitor structures Cap. The antifuse cell array 220 may include the second substrate SUB2, antifuse bit lines aBL, first and second vertical-channel layers CHr and CHp, a plurality of second gate electrodes 221, second gate insulating layers 222, and coupling conductors 227.

In some implementations, the memory cell array 210 and the antifuse cell array 220 may include vertical channel transistors (VCTs). The vertical channel transistors may refer to structures in which the memory vertical-channel layers CH, the first vertical-channel layers CHr, and the second vertical-channel layers CHp extend along the third direction D3 which is the vertical direction from the second substrate SUB2. The third direction D3 is perpendicular to the first direction D1 in which the bit lines BL extend and the second direction D2 in which the first gate electrodes 211 extend.

On the second substrate SUB2, the bit lines BL may extend in the first direction D1. Although not shown in the drawings, in the memory cell array 210, a plurality of bit lines BL may be disposed, and in the regions between the plurality of bit lines BL, insulating patterns may be disposed. The insulating patterns may extend in the first direction D1, and the upper surfaces of the insulating patterns may be disposed on a level with the upper surfaces of the bit lines BL.

As an example, the bit lines BL may contain doped polysilicon, a metal, conductive metal nitride, conductive metal silicide, conductive metal oxide, or a combination thereof. For example, the bit lines BL may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof; but are not limited thereto. The bit lines BL may include a single layer or multiple layers formed of the above-mentioned materials. In some implementations, the bit lines BL may contain a two-dimensional semiconductor material, and examples of the two-dimensional semiconductor material may include graphene, carbon nanotubes, and combinations thereof.

The memory vertical-channel layers CH may be disposed so as to be spaced apart from one another in the first direction D1 on the bit lines BL. Although not shown in the drawings, the memory vertical-channel layers may be arranged on the plurality of bit lines, in a matrix form in which they are spaced apart from one another in the first direction D1 and the second direction D2. The bottom portions of the memory vertical-channel layers CH may function as first source/drain regions, and the upper portions of the memory vertical-channel layers CH may function as second source/drain regions, and the portions of the memory vertical-channel layers CH between the first and second source/drain regions may function as channel regions.

As an example, the memory vertical-channel layers CH may contain silicon, oxide semiconductors, or a combination thereof, and for example, the oxide semiconductors may include $In_xGa_yZn_zO$(IGZO), $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The memory vertical-channel layers CH may include a single layer or multiple layers formed of the above-mentioned oxide semiconductors. In some implementations, the memory vertical-channel layers CH may have a bandgap energy greater than the bandgap energy of silicon. For example, the memory vertical-channel layers CH may have a bandgap energy in a range from about 1.5 eV to 5.6 eV. For example, the memory vertical-channel layers CH may have optimal channel performance when having a bandgap energy in a range from about 2.0 eV to 4.0 eV. For example, the memory vertical-channel layers CH may be polycrystalline or amorphous, but is not limited thereto. In implementations, the memory vertical-channel layers CH may contain a two-dimensional semiconductor material, and examples of the two-dimensional semiconductor material may include graphene, carbon nanotubes, and combinations thereof.

The first gate electrodes 211 may extend in the second direction D2 on two side walls of each of the memory vertical-channel layers CH. The first gate electrodes 211 may include first sub gate electrodes 211*g* facing first side walls of the memory vertical-channel layers CH, and first back-gate electrodes 211*bg* facing second side walls of the memory vertical-channel layers CH opposite to the first side walls. Each first sub gate electrode 211*g* may function as one of the plurality of word lines WL in FIG. 1, and the first back-gate electrodes 211*bg* may perform a function of forming the bottom potentials of the vertical channel transistors including the memory vertical-channel layers CH.

The first gate electrodes 211 may contain doped polysilicon, a metal, conductive metal nitride, conductive metal silicide, conductive metal oxide, or a combination thereof. For example, the first gate electrodes 211 may be formed of doped silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof; but are not limited thereto.

The first gate insulating layers 212 may be disposed so as to surround the first gate electrodes 211, and at least some portions of the first gate insulating layers 212 may be interposed between the first gate electrodes 211 and the memory vertical-channel layers CH. In FIG. 7, the first gate insulating layers 212 are disposed so as to surround the first gate electrodes 211; however, in some implementations, the first gate electrodes 211 may be disposed along at least some portions of the side walls of the first gate insulating layers 212.

In some implementations, the first gate insulating layers 212 may consist of silicon oxide films, silicon oxynitride films, high dielectric films having a dielectric constant larger than those of silicon oxide films, or a combination thereof. The high dielectric films may be formed of metal oxide or metal oxynitride. For example, high dielectric films that are usable as the first gate insulating layers 212 may be formed of $HfO_2$, HfSiO, HfSiON, HfTaO, HfTiO, HfZrO, $ZrO_2$, $Al_2O_3$, or a combination thereof, but are not limited thereto.

In the regions between the first gate electrodes 211 and the memory vertical-channel layers CH on the bit lines BL, a first interlayer insulating layer 213 may be disposed. In FIG. 7, the first interlayer insulating layer 213 is shown as one continuous material layer; however, in some implementations, the first interlayer insulating layer 213 may be formed in the form of a plurality of insulating patterns.

On the memory vertical-channel layers CH, capacitor contact 215 may be disposed. The capacitor contacts 215 may be disposed so as to vertically overlap the memory vertical-channel layers CH in the third direction D3. The capacitor contacts 215 may be formed of doped silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto. A first upper insulating layer 214 may surround the side walls of the capacitor contacts 215 on the first interlayer insulating layer 213.

On the first upper insulating layer 214, a first etch stop layer 216 may be disposed, and on the first etch stop layer 216, capacitor structures Cap may be disposed. The capacitor structures Cap may include lower electrodes 217, capacitor dielectric layers 218, and upper electrodes 219.

The lower electrodes 217 may pass through the first etch stop layer 216 and be electrically coupled to the upper surfaces of the capacitor contacts 215. The lower electrodes 217 may be formed in the form of a pillar extending in the third direction D3, but are not limited thereto. In some implementations, the lower electrodes 217 may be disposed so as not to overlap the capacitor contacts 215 plane-wise along the third direction D3. Alternatively, landing pads may be further disposed between the capacitor contacts 215 and the lower electrodes 217, and the lower electrodes 217 may be arranged in a hexagonal shape.

A first gate electrode 211, a memory vertical-channel layer CH, and a capacitor structure Cap may function as one memory cell MC, and may correspond to one of the plurality of memory cells MC in FIG. 1.

The second substrate SUB2, the antifuse bit lines aBL, the first and second vertical-channel layers CHr and CHp, the plurality of second gate electrodes 221, and the second gate insulating layers 222 in the antifuse cell array 220 may correspond to the second substrate SUB2, the bit lines BL, the memory vertical-channel layers CH, the plurality of first gate electrodes 211, and the first gate insulating layers 212 in the memory cell array 210, respectively.

Hereinafter, for ease of explanation, a description of the components in the antifuse cell array 220 will be made with a focus on the differences from the components in the memory cell array 210 corresponding to them, and a description of things in common will not be made.

The upper portions of the first vertical-channel layers CHr may function as the drain terminals of the read transistors RTr in FIG. 3, and the bottom portions of the first vertical-channel layers CHr may function as the source terminals of the read transistors RTr in FIG. 3.

The lower surfaces of the second vertical-channel layers CHp may be spaced apart from the upper surfaces of the antifuse bit lines aBL by a floating distance d, and the second vertical-channel layers CHp may extend in the third direction D3. A second interlayer insulating layer 223 may be disposed in the regions between the lower surfaces of the second vertical-channel layers CHp and the upper surfaces of the antifuse bit lines aBL.

In some implementations, the upper surfaces of the first vertical-channel layers CHr and the upper surfaces of the second vertical-channel layers CHp may be disposed on a level with the upper surfaces of the memory vertical-channel layers CH.

The bottom portions of the second vertical-channel layers CHp may correspond to the source/drain regions, but the bottom portions of the second vertical-channel layers CHp may be in a floating state due to the arrangement between the antifuse bit lines aBL and the second vertical-channel layers CHp. The upper portions of the second vertical-channel layers CHp may function as the source terminals of the program transistors PTr in FIG. 3, and the bottom portions of the second vertical-channel layers CHp may function as the drain terminals of the program transistors PTr in FIG. 3.

The second gate electrodes 221 may include read gate electrodes 221*gr* facing first side walls of the first vertical-channel layers CHr, second back-gate electrodes 221*bg* facing second side walls of the first vertical-channel layers CHr opposite to the first side walls, and program gate electrodes 221*gp*, each of which faces one side wall of a second vertical-channel layer CHp. The program gate electrodes 221*gp* may be disposed on the opposite sides of the second vertical-channel layers CHp to the second back-gate electrodes 221*bg*. A read gate electrodes 221*gr* may function as the 0-th read word line WLR<0> in FIG. 3 coupled to the read transistors RTr, and a program gate electrode 221*gp* may function as the 0-th program word line WLP<0> in FIG. 3 coupled to the program transistors PTr. The second back-gate electrodes 221*bg* may perform a function of forming the bottom potentials of the vertical channel transistors including the first vertical-channel layers CHr and the second vertical-channel layers CHp.

Coupling contacts 225 may be disposed on the first vertical-channel layers CHr and the second vertical-channel layers CHp. The coupling contacts 225 may be disposed so as to overlap the memory vertical-channel layers CH plane-wise along the third direction D3. A second upper insulating layer 224 may surround the side walls of the coupling contacts 225 on the second interlayer insulating layer 223.

On the second upper insulating layer 224, a second etch stop layer 226 may be disposed, and coupling conductors 227 may be disposed on a level with the second etch stop layer 226. Each coupling conductor 227 may be in contact with two coupling contacts 225, thereby electrically coupling the upper portion of a first vertical-channel layer CHr and the upper portion of a second vertical-channel layer CHp.

As an example, the coupling conductors 227 may contain doped polysilicon, a metal, conductive metal nitride, conductive metal silicide, conductive metal oxide, or a combination thereof.

A capping pattern 228 may be disposed on the coupling conductors 227 and the second upper insulating layer 224 so as to cover the antifuse cell array 220. In FIG. 7, the insulating patterns, the upper insulating layer, the lower insulating layer, and the interlayer insulating layers are shown as being separated from one another; however, in some implementations, the insulating patterns, the upper insulating layer, the lower insulating layer, and the interlayer insulating layers may be formed as one insulating layer.

A second gate electrode 221, a first vertical-channel layer CHr, a second vertical-channel layer CHp, and a coupling conductor 227 may function as one antifuse cells (Fuse), and may correspond to the (0, 0)-th antifuse cell Fuse_00*a* in FIG. 3.

Referring to FIG. 8, a memory device 10*a* may be a C2C (chip to chip) structure. The C2C structure may refer to a structure that is formed by manufacturing an upper chip including a memory cell region CS on a first wafer, manufacturing a lower chip including a peripheral circuit region PS on a second wafer different from the first wafer, and coupling the upper chip and the lower chip together by a bonding method. For example, the bonding method may refer to a method of electrically coupling bonding metals formed in the uppermost metal layer of the upper chip and bonding metals formed in the uppermost metal layer of the lower chip to each other. For example, when the bonding metals are formed of copper (Cu), the above-mentioned bonding method may be a Cu—Cu bonding method, and the bonding metals may be formed of aluminum or tungsten.

In the memory device 10*a*, each of the peripheral circuit region PS and the memory cell region CS may include an external pad bonding area PA, an antifuse bonding area AFBA, and a memory cell bonding area MCBA.

The peripheral circuit region PS may include a first substrate SUB1, a first interlayer insulating layer 102, a plurality of circuit element 150*a*, 150*b*, and 150*c* formed on the first substrate SUB1, first metal layer 160*a*, 160*b*, and 160*c* that are coupled to the plurality of circuit elements 150*a*, 150*b*, and 150*c*, respectively, and second metal layers 170*a*, 170*b*, and 170*c* that are formed on the first metal layers 160*a*, 160*b*, and 160*c*. In some implementations, the first metal layers 160*a*, 160*b*, and 160*c* may be formed of tungsten having relatively high resistance, and the second metal layers 170*a*, 170*b*, and 170*c* may be formed of copper having relatively low resistance.

In this specification, only the first metal layers 160*a*, 160*b*, and 160*c* and the second metal layers 170*a*, 170*b*, and 170*c* are shown in the drawing; however, the present disclosure is not limited thereto, and on the second metal layers 170*a*, 170*b*, and 170*c*, at least one metal layer may be further formed. At least some of one or more metal layers that are formed on the second metal layers 170*a*, 170*b*, and 170*c* may be formed of a material having resistance lower than that of copper forming the second metal layers 170*a*, 170*b*, and 170*c*, such as aluminum, etc.

The first interlayer insulating layer 102 may be disposed on the first substrate SUB1 so as to cover the plurality of circuit elements 150*a*, 150*b*, and 150*c*, the first metal layers 160*a*, 160*b*, and 160*c*, and the second metal layers 170*a*, 170*b*, and 170*c*, and may contain an insulating material such as silicon oxide, silicon nitride, etc.

The memory cell region CS may provide at least one of a plurality of memory cells MC and antifuse cells (Fuse). The memory cell region CS may include a second substrate SUB2, bit lines BL, antifuse bit lines aBL, first metal layers 260*b* and 260*c* that are coupled to the antifuse bit lines aBL and the bit lines BL, respectively, and second metal layers 270*b* and 270*c* that are formed on the first metal layers 260*b* and 260*c*. In some implementations, the first metal layers 260*b* and 260*c* may be formed of tungsten having relatively high resistance, and the second metal layers 270*b* and 270*c* may be formed of copper having relatively low resistance.

The bit lines BL and the antifuse bit lines aBL may be disposed so as to extend in the first direction D1 in parallel with the lower surface of the second substrate SUB2.

In the implementation shown in FIG. 8, the region in which the plurality of memory cells MC, the bit lines BL, and so on are disposed may be defined as the memory cell bonding area MCBA.

In the memory cell bonding area MCBA, the plurality of memory cells MC may extend in a direction perpendicular to the upper surface of the second substrate SUB2. The plurality of memory cells MC may be electrically coupled to the first metal layers 260*c* and the second metal layers 270*c*. For example, the first metal layers 260*c* may be bit line contacts.

On the second metal layers 170*c* in the memory cell bonding area MCBA, lower bonding metals 181*c* and 182*c* may be formed. In the memory cell bonding area MCBA, lower bonding metals 181*c* and 182*c* in the peripheral circuit region PS may be electrically coupled to upper bonding metals 281*c* and 282*c* in the memory cell region CS by a bonding method, and the lower bonding metals 181*c* and 182*c* and the upper bonding metals 281*c* and 282*c* may be formed of aluminum, copper, tungsten, etc.

The bit lines BL may be electrically coupled to the circuit elements 150*c* that provide a sense amplifier 110 in the peripheral circuit region PS, in the memory cell bonding area MCBA. For example, the bit lines BL may be coupled to the upper bonding metals 281*c* and 282*c* in the memory cell region CS, and the upper bonding metals 281*c* and 282*c* may be coupled to the lower bonding metals 181*c* and 182*c* that are coupled to the circuit elements 150*c* of the sense amplifier 110. At least some components of the sense amplifier 110 may overlap the plurality of memory cells MC and the bit lines BL plane-wise along the third direction D3.

In the antifuse bonding area AFBA, the antifuse bit lines aBL may extend along the first direction D1 parallel with the lower surface of the second substrate SUB2. The antifuse bit lines aBL may be electrically coupled to the first metal layers 260*b* and the second metal layers 270*b*. For example, the first metal layers 260*b* may be antifuse bit line contacts. In the antifuse bonding area AFBA, the first metal layers 260*b* and the second metal layers 270*b* may be coupled to the peripheral circuit region PS through the upper bonding metals 281*b* and 282*b* of the memory cell region CS and lower bonding metals 181*b* and 182*b* of the peripheral circuit region PS.

On the second metal layers 170*b* of the antifuse bonding area AFBA, the lower bonding metals 181*b* and 182*b* may be formed. In the antifuse bonding area AFBA, the lower bonding metals 181*b* and 182*b* of the peripheral circuit region PS may be electrically coupled to the upper bonding metals 281*b* and 282*b* of the memory cell region CS by a bonding method, and the lower bonding metals 181*b* and 182*b* and the upper bonding metals 281*b* and 282*b* may be formed of aluminum, copper, tungsten, etc.

The antifuse bit lines aBL may be electrically coupled to the circuit elements 150*b* that provide an antifuse sense amplifier 120 in the peripheral circuit region PS. In some implementations, the antifuse sense amplifier 120 may overlap at least a portion of an antifuse cell array (reference symbol "220" in FIG. 2) including antifuse cells (Fuse) plane-wise along the third direction D3.

Meanwhile, the external pad bonding area PA may include first external pads 107 that are disposed on the peripheral circuit region PS and second external pads 104 that are disposed on the memory cell region CS. Referring to FIG. 8, on the lower surface of the first substrate SUB1, a lower insulating layer 103 may be formed so as to cover the lower surface of the first substrate SUB1, and on the lower insulating layer 103, the first external pads 107 may be formed. Each first external pad 107 may be coupled to at least one of the plurality of circuit elements 150*a*, 150*b*, and 150*c*, which is disposed in the peripheral circuit region PS, through a first external contact plug 108, and may be separated from the first substrate SUB1 by the lower insulating layer 103. Although not shown in the drawing, between the first external contact plug 108 and the first substrate SUB1, a side-surface insulating layer may be disposed so as to electrically separate the first external contact plug 108 and the first substrate SUB1.

On the upper surface of the second substrate SUB2, an upper insulating layer 203 may be formed so as to cover the upper surface of the second substrate SUB2, and on the upper insulating layer 203, the second external pads 104 may be formed. Each second external pad 104 may be electrically coupled to at least one of the plurality of circuit elements 150*a*, 150*b*, and 150*c*, which is disposed in the peripheral circuit region PS, through a second external contact plug 105 which extends in the third direction D3 and passes through a second interlayer insulating layer 202 of the memory cell region CS. The second external pad 104 may be separated from the second substrate SUB2 by the upper insulating layer 203. The second external contact plug 105 may be coupled to upper bonding metals 281*a* and 282*a*, and the upper bonding metals 281*a* and 282*a* may be coupled to the lower bonding metals 181*a* and 182*a* which are coupled to the circuit elements 150*a* of the peripheral circuit region PS, by bonding. The lower bonding metals 181*a* and 182*a* and the upper bonding metals 281*a* and 282*a* may be formed of aluminum, copper, tungsten, etc.

Additionally, in the antifuse bonding area AFBA, upper metal patterns 283*b* may be formed in the uppermost metal layer of the memory cell region CS in the same form as that of lower metal patterns 183*b* formed in the uppermost metal layer of the peripheral circuit region PS, so as to correspond to the lower metal patterns 183*b*. On the upper metal patterns 283*b* formed in the uppermost metal layer of the memory cell region CS, contacts may not be formed.

Similarly, in the memory cell bonding area MCBA, upper metal patterns 283*c* may be formed in the uppermost metal layer of the memory cell region CS in the same form as that of lower metal patterns 183*c* formed in the uppermost metal layer of the peripheral circuit region PS, so as to correspond to the lower metal patterns 183*c*. On the upper metal patterns 283*c* formed in the uppermost metal layer of the memory cell region CS, contacts may not be formed.

Figure 9:
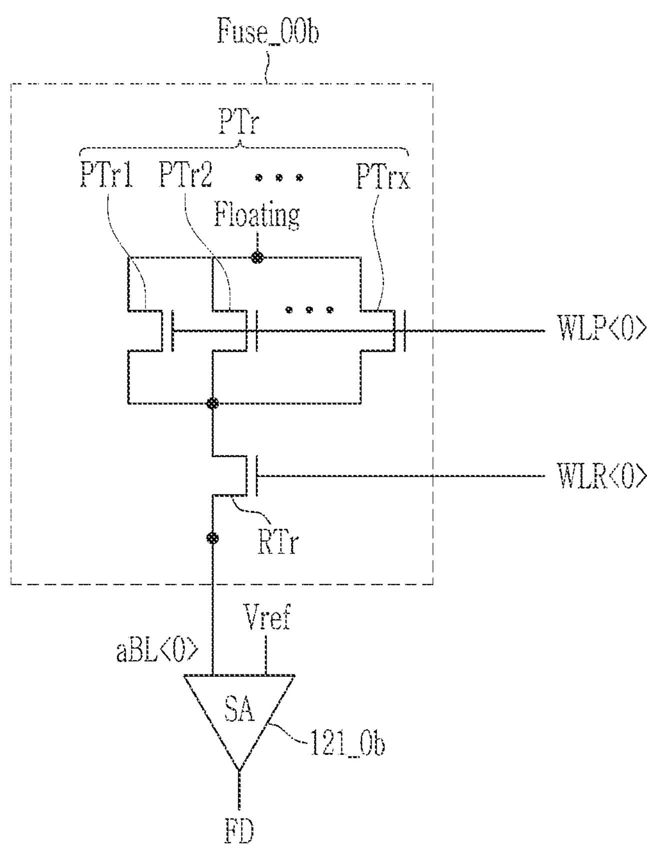
FIG. 9 is a circuit diagram illustrating another example of an antifuse cell.

FIG. 9 is a circuit diagram illustrating another example of an antifuse cell. A (0, 0)-th antifuse cell Fuse_00*b* in FIG. 9 may correspond to the (0, 0)-th antifuse cell Fuse_00*a* in FIG. 3. For ease of explanation, the following description will be made with a focus on the differences between the (0, 0)-th antifuse cell Fuse_00*b* in FIG. 9 and the (0, 0)-th antifuse cell Fuse_00*a* in FIG. 3.

Referring to FIG. 3 and FIG. 9 together, the (0, 0)-th antifuse cell Fuse_00*b* may include program transistors PTr including first to x-th program transistors PTr1 to PTrx. Each of the first to x-th program transistors PTr1 to PTrx may correspond to the program transistors PTr in FIG. 3. The first to x-th program transistors PTr1 to PTrx may be operated by the 0-th program word line WLP<0>.

One terminal of each of the first to x-th program transistors PTr1 to PTrx may be coupled to a read transistor RTr. The first to x-th program transistors PTr1 to PTrx may be electrically coupled to the antifuse bit line aBL<0> through the read transistor RTr. Another terminal of each of the first to x-th program transistors PTr1 to PTrx may be floated, such that the first to x-th program transistors PTr1 to PTrx are coupled in parallel with one another between the 0-th program word line WLP<0> and the read transistor RTr.

The (0, 0)-th antifuse cell Fuse_00*b* may be disposed in a middle region 210D in FIG. 5, in a COP structure, such that the area that is occupied by one antifuse cell in the present disclosure is large. Accordingly, the (0, 0)-th antifuse cell Fuse_00*b* may include at least two program transistors PTr1 to PTrx, and include at least three transistors PTr1 to PTrx and RTr to improve the performance of a read operation on the antifuse cell.

Figure 10:
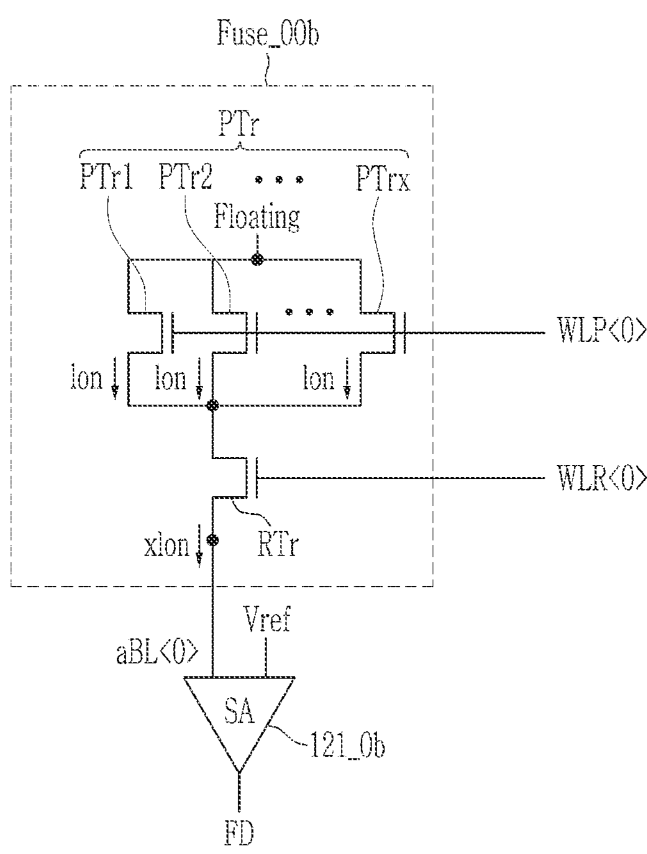
FIG. 10 and FIG. 11 are example views for explaining the operation of the memory device.
Figure 11:
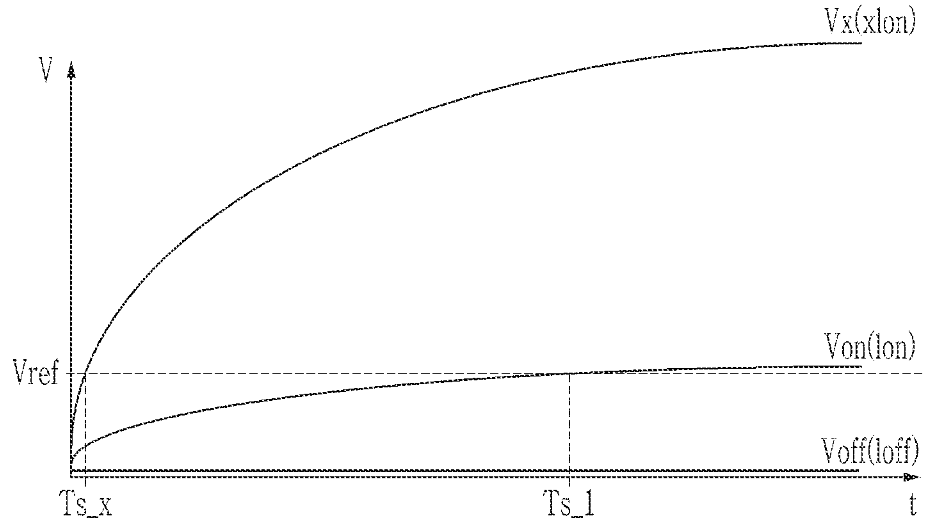

FIG. 10 and FIG. 11 are example views for explaining the operation of the memory device.

Referring to FIG. 9 to FIG. 11, after a programming or rupturing operation is performed on the (0, 0)-th antifuse cell Fuse_00*b* by the 0-th program word line WLP<0>, a read operation may be performed on the (0, 0)-th antifuse cell Fuse_00*b* by the 0-th program word line WLP<0> and the 0-th read word line WLR<0>.

When the read voltage is applied by the 0-th program word line WLP<0>, each of the first to x-th program transistors PTr1 to PTrx may output program current Ion to the read transistor RTr.

The read transistor RTr may output parallel program current xIon to the 0-th antifuse sense amplifier 121_0*b* on the basis of the program current Ion output from the x number of program transistors PTr1 to PTrx.

The 0-th antifuse sense amplifier 121_0*b* may generate a parallel generation voltage Vx based on the parallel program current xIon related to the first to x-th program transistors PTr1 to PTrx during the read operation. The 0-th antifuse sense amplifier 121_0*b* may compare the parallel generation voltage Vx and the reference voltage Vref, and determine that the (0, 0)-th antifuse cell Fuse_00*b* has been programmed, when the parallel generation voltage Vx is greater than the reference voltage Vref. The 0-th antifuse sense amplifier 121_0*b* may detect and output fuse data FD on the basis of whether the antifuse cell has been programmed or not.

When the antifuse sense amplifier detects fuse data FD based on the program current Ion, it is possible to detect the fuse data FD at a program detection time Ts_1. The 0-th antifuse sense amplifier 121_0*b* may detect the fuse data FD based on the parallel program current xIon, thereby detecting the fuse data FD in a parallel detection time Ts_x.

The (0, 0)-th antifuse cell Fuse_00*b* of the present disclosure may be the parallel arrangement of the first to x-th program transistors PTr1 to PTrx to improve the speed of a read operation.

The 0-th antifuse sense amplifier 121_0*b* cannot detect fuse data FD indicating that the (0, 0)-th antifuse cell Fuse_00*b* has been programmed, on the basis of an off generation voltage Voff generated by off current Ioff.

Figure 12:
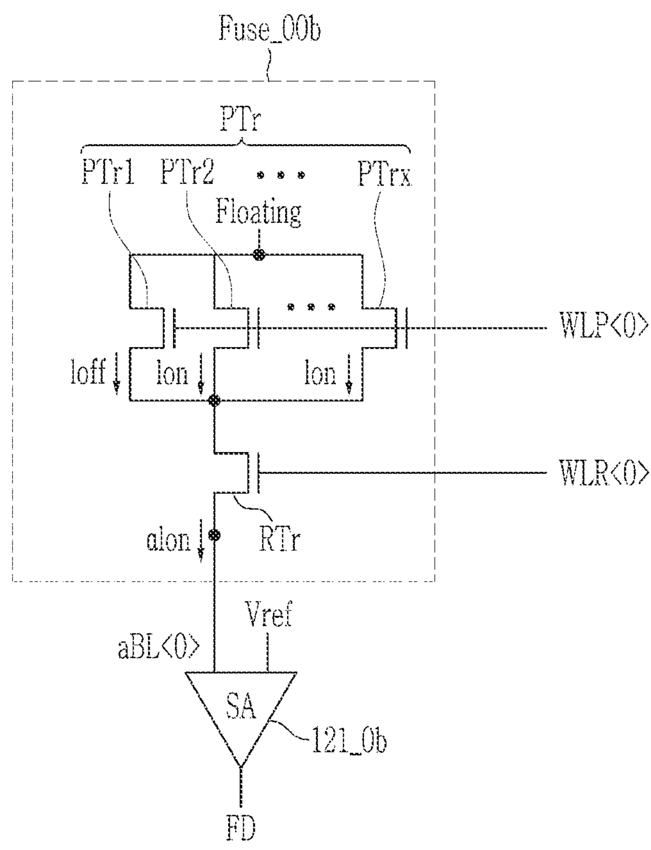
FIG. 12 is another example view for explaining the operation of the memory device.

FIG. 12 is another example view for explaining the operation of the memory device.

Referring to FIG. 9 and FIG. 12, after a programming or rupturing operation is performed on the (0, 0)-th antifuse cell Fuse_00*b* by the 0-th program word line WLP<0>, a read operation may be performed on the (0, 0)-th antifuse cell Fuse_00*b* by the 0-th program word line WLP<0> and the 0-th read word line WLR<0>.

Although a breakdown voltage is applied to the first to x-th program transistors PTr1 to PTrx, some of the first to x-th program transistors PTr1 to PTrx may not be ruptured due to operation errors. Some program transistors that have not been ruptured may output off current Ioff during the read operation.

In some implementations, some of the first to x-th program transistors PTr1 to PTrx may output program current Ion during the read operation, and the others of the first to x-th program transistors PTr1 to PTrx may output off current Ioff.

For example, referring to FIG. 12, after the breakdown voltage is applied to the first to x-th program transistors PTr1 to PTrx by the 0-th program word line WLP<0>, the first program transistor PTr1 may not be ruptured, and the rest of the first to x-th program transistors PTr1 to PTrx except the first program transistor PTr1 may be ruptured. Thereafter, during the read operation on the (0, 0)-th antifuse cell Fuse_00*b*, the first program transistor PTr1 may output the off current Ioff, and the rest of the program transistors except the first program transistor PTr1 may output the program current Ion.

The read transistor RTr may provide some program current alon to the 0-th antifuse sense amplifier 121_0*b*, on the basis of the program current Ion of the rest of the program transistors except the first program transistor PTr1.

The 0-th antifuse sense amplifier 121_0*b* may normally detect and output the fuse data FD of the (0, 0)-th antifuse cell Fuse_00*b* based on the program current Ion of the rest of the program transistors except the malfunctioned first program transistor PTr1. The (0, 0)-th antifuse cell Fuse_00*b* of the present disclosure may be a parallel arrangement of the first to x-th program transistors PTr1 to PTrx to improve the reliability of a read operation on the (0, 0)-th antifuse cell Fuse_00*b*.

Figure 13:
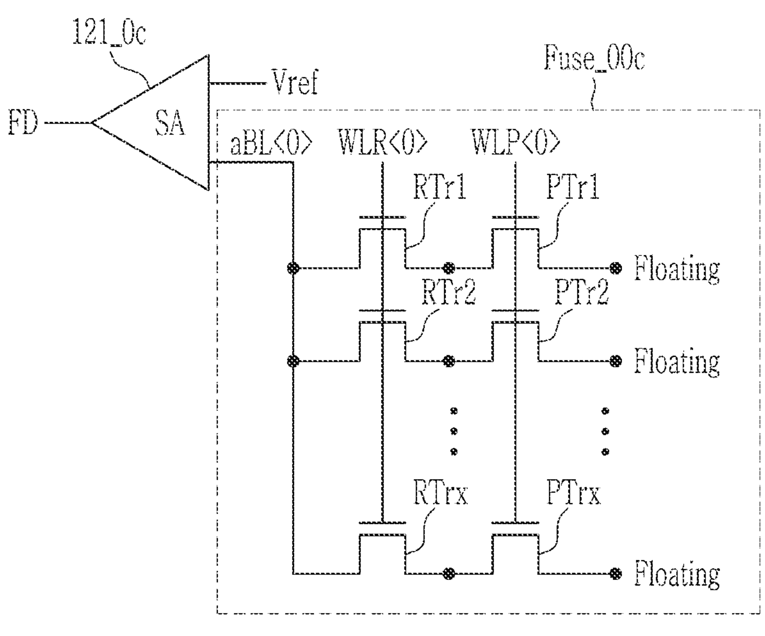
FIG. 13 is a circuit diagram illustrating another example of an antifuse cell.

FIG. 13 is a circuit diagram illustrating another example of an antifuse cell. A (0, 0)-th antifuse cell Fuse_00*c* in FIG. 13 may correspond to the (0, 0)-th antifuse cell Fuse_00*a* in FIG. 2. For ease of explanation, the following description will be made with a focus on the difference between the (0, 0)-th antifuse cell Fuse_00*c* in FIG. 13 and the (0, 0)-th antifuse cell Fuse_00*a* in FIG. 2.

The (0, 0)-th antifuse cell Fuse_00*c* may include read transistors RTr including first to x-th read transistors RTr1 to RTrx, and program transistors PTr including first to x-th program transistors PTr1 to PTrx.

Each of the first to x-th read transistors RTr1 to RTrx may correspond to the read transistor RTr in FIG. 2. The first to x-th read transistors RTr1 to RTrx may be operated by a 0-th read word line WLR<0>. One terminal of each of the first to x-th read transistors RTr1 to RTrx may be coupled to a 0-th antifuse bit line aBL<0>.

Each of the first to x-th program transistors PTr1 to PTrx may correspond to the program transistor PTr in FIG. 2. The first to x-th program transistors PTr1 to PTrx may be operated by a 0-th program word line WLP<0>. One terminal of each of the first to x-th program transistors PTr1 to PTrx may be coupled to another terminal of a corresponding read transistor of the first to x-th read transistors RTr1 to RTrx.

Accordingly, after a rupturing operation is performed on the first program transistor PTr1, the first program transistor PTr1 and the first read transistor RTr1 may be coupled in series between the 0-th antifuse bit line aBL<0> and the 0-th program word line WLP<0>. Similarly, after a rupturing operation is performed on the second program transistor PTr2, the second program transistor PTr2 and the second read transistor RTr2 may be coupled in series between the 0-th antifuse bit line aBL<0> and the 0-th program word line WLP<0>. The series connection relationship between the rest of the program transistors and the rest of the read transistors after the rupturing operation may correspond to the series connection relationship between the first program transistor PTr1 and the first read transistor RTr1 as shown in FIG. 13.

After the rupturing operation is performed on the first to x-th program transistors PTr1 to PTrx, the first program transistor PTr1 and the first read transistor RTr1 may be coupled to the second program transistor PTr2 and the second read transistor RTr2 in parallel, between the 0-th antifuse bit line aBL<0> and the 0-th program word line WLP<0>. Similarly, after the rupturing operation is performed on the first to x-th program transistors PTr1 to PTrx, the first program transistor PTr1 and the first read transistor RTr1 may be coupled to the third program transistor PTr3 and the third read transistor RTr3 in parallel, between the 0-th antifuse bit line aBL<0> and the 0-th program word line WLP<0>. The parallel connection relationship between the rest of the program transistors and the rest of the read transistors after the rupturing operation is performed on the first to x-th program transistors PTr1 to PTrx may correspond to the parallel connection relationship between the first program transistor PTr1 and the first read transistor RTr1, and the second program transistor PTr2 and the second read transistor RTr2 as shown in FIG. 13.

Figure 14:
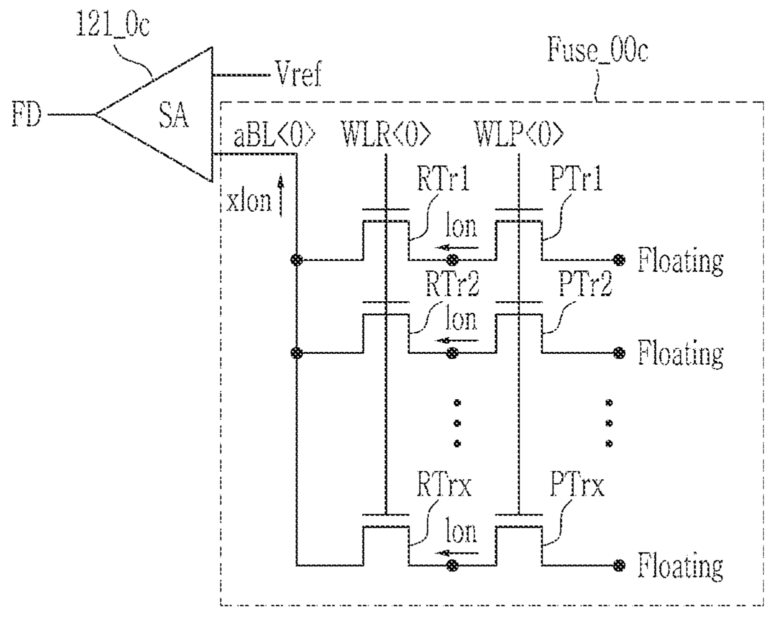
FIG. 14 is another example view for explaining the operation of a memory device.

FIG. 14 is another example view for explaining the operation of a memory device.

Referring to FIG. 14, after a programming or rupturing operation is performed on the (0, 0)-th antifuse cell Fuse_00*c* by the 0-th program word line WLP<0>, a read operation is performed on the (0, 0)-th antifuse cell Fuse_00*c* by the 0-th program word line WLP<0> and the 0-th read word line WLR<0>.

When the read voltage is applied by the 0-th program word line WLP<0>, the first to x-th program transistors PTr1 to PTrx may output program current Ion to the first to x-th read transistors RTr1 to RTrx, respectively.

The first to x-th read transistors RTr1 to RTrx may output the program current Ion output by the program transistors PTr1 to PTrx to a 0-th antifuse sense amplifier 121_0*c*. The 0-th antifuse sense amplifier 121_0*c* may receive parallel program current xIon based on the program current Ion output from the first to x-th read transistors RTr1 to RTrx.

The 0-th antifuse sense amplifier 121_0*c* may detect and output fuse data FD on the basis of the parallel program current xIon related to the first to x-th read transistors RTr1 to RTrx during the read operation.

Figure 15:
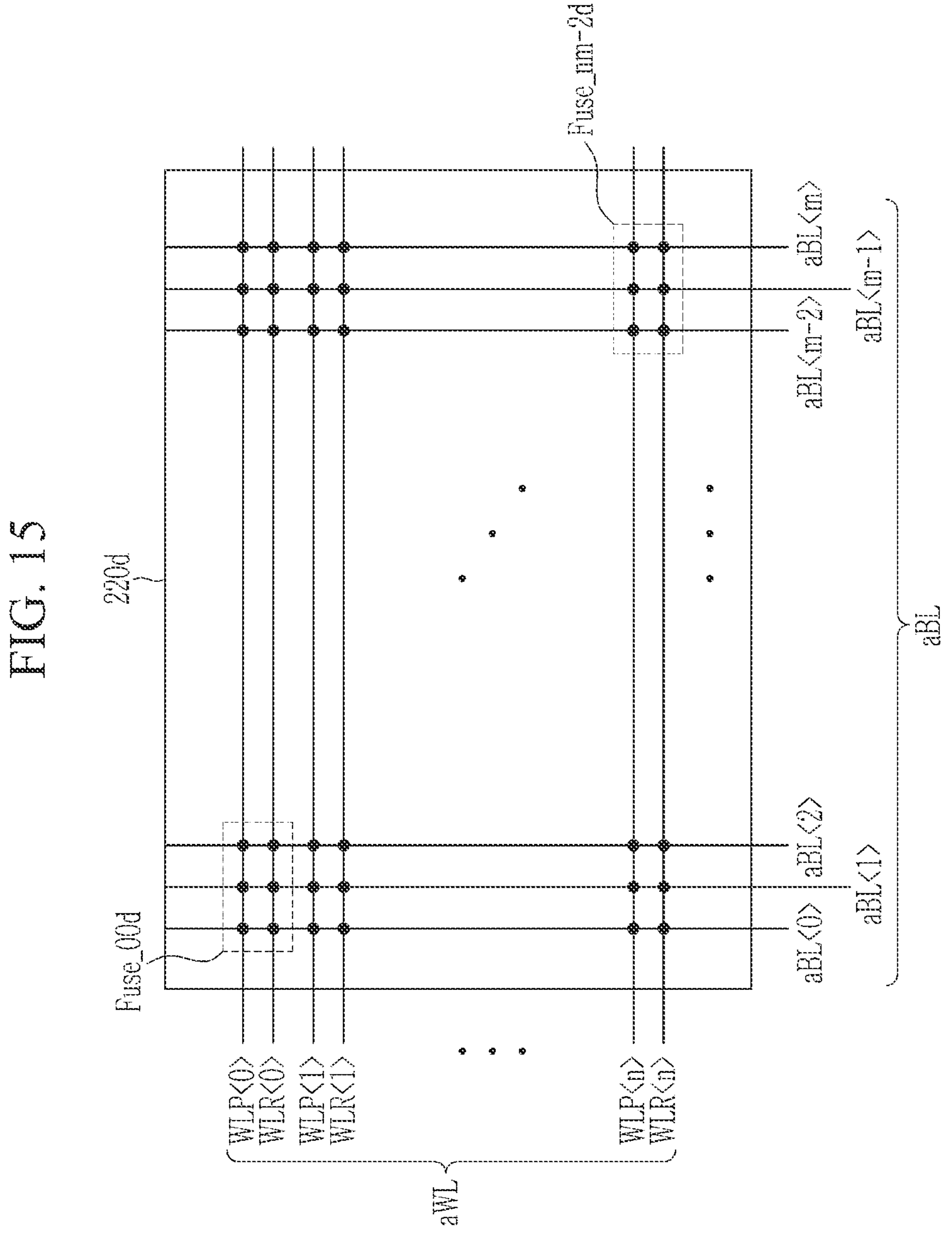
FIG. 15 and FIG. 16 are example views for explaining an antifuse cell array.
Figure 16:
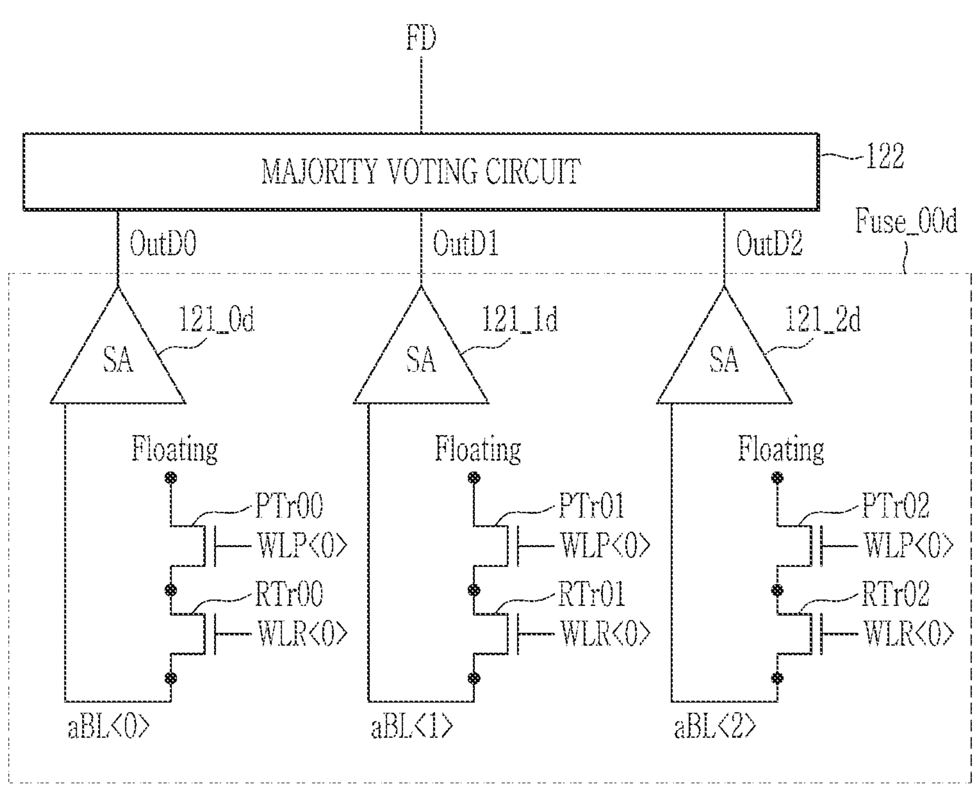

FIG. 15 and FIG. 16 are example views for explaining an antifuse cell array. A (0, 0)-th antifuse cell Fuse_00*d* and an antifuse cell array 220*d* in FIG. 15 and FIG. 16 may correspond to the (0, 0)-th antifuse cell Fuse_00*a* and the antifuse cell array 220*a* in FIG. 2 and FIG. 3. For ease of explanation, the following description will be made with a focus on the differences between the (0, 0)-th antifuse cell Fuse_00*d* and the antifuse cell array 220*d*, and the (0, 0)-th antifuse cell Fuse_00*a* and the antifuse cell array 220*a*.

The antifuse cell array 220*d* may include a plurality of antifuse cells Fuse_00*d* to Fuse_nm-2*d* arranged in (n+1) number of rows and (m+1)/3 number of columns. In some implementations, m may be 3l–l, wherein l may be an integer equal to or greater than 2.

In the antifuse cell array 220*d*, among a plurality of antifuse bit lines aBL, three antifuse bit lines that are adjacent and are activated together may function like one column. For example, the 0-th to second antifuse bit lines aBL<0> to aBL<2> may operate like one column in the burst mode, such that the 0-th to second antifuse bit lines aBL<0> to aBL<2> are coupled to the (0, 0)-th antifuse cell Fuse_00d.

Hereinafter, the plurality of antifuse cells Fuse_00d to Fuse_nm-2d will be described as having the same configuration, and a specific description of the plurality of antifuse cells Fuse_00d to Fuse_nm-2d may be replaced by a description of the (0, 0)-th antifuse cell Fuse_00d.

The (0, 0)-th antifuse cell Fuse_00d may include (0, 0)-th to (0, 2)-th read transistors RTr00 to RTr02 and (0, 0)-th to (0, 2)-th program transistors PTr00 to PTr02.

The gate terminals of the (0, 0)-th to (0, 2)-th read transistors RTr00 to RTr02 may be coupled to the 0-th read word line WLR<0>, and the gate terminals of the (0, 0)-th to (0, 2)-th program transistors PTr00 to PTr02 may be coupled to the 0-th program word line WLP<0>. The (0, 0)-th to (0, 2)-th read transistors RTr00 to RTr02 may be operated by the 0-th read word line WLR<0>, and the (0, 0)-th to (0, 2)-th program transistors PTr00 to PTr02 may be operated by the 0-th program word line WLP<0>.

One terminal of the (0, 0)-th read transistor RTr00 may be coupled to the 0-th antifuse bit line aBL<0>. Another terminal of the (0, 0)-th read transistor RTr00 may be coupled to one terminal of the (0, 0)-th program transistor PTr00 such that the (0, 0)-th program transistor PTr00 is electrically coupled to the 0-th antifuse bit line aBL<0> through the (0, 0)-th read transistor RTr00. Another terminal of the (0, 0)-th program transistor PTr00 may be floated such that the (0, 0)-th program transistor PTr00 can function as a two-terminal element having a gate terminal and a source terminal. In other words, after a rupturing operation is performed on the (0, 0)-th program transistor PTr00, the (0, 0)-th read transistor RTr00 and the (0, 0)-th program transistor PTr00 may be coupled in series between the 0-th antifuse bit line aBL<0> and the 0-th program word line WLP<0>.

One terminal of the (0, 1)-th read transistor RTr01 may be coupled to the first antifuse bit line aBL<1>. Another terminal of the (0, 1)-th read transistor RTr01 may be coupled to one terminal of the (0, 1)-th program transistor PTr01 such that the (0, 1)-th program transistor PTr01 is electrically coupled to the first antifuse bit line aBL<1> through the (0, 1)-th read transistor RTr01. Another terminal of the (0, 1)-th program transistor PTr01 may be floated such that the (0, 1)-th program transistor PTr01 can function as a two-terminal element having a gate terminal and a source terminal. In other words, after a rupturing operation is performed on the (0, 1)-th program transistor PTr01, the (0, 1)-th read transistor RTr01 and the (0, 1)-th program transistor PTr01 may be coupled in series between the first antifuse bit line aBL<1> and the first program word line WLP<1>.

One terminal of the (0, 2)-th read transistor RTr02 may be coupled to the second antifuse bit line aBL<2>. Another terminal of the (0, 2)-th read transistor RTr02 may be coupled to one terminal of the (0, 2)-th program transistor PTr02 such that the (0, 2)-th program transistor PTr02 is electrically coupled to the second antifuse bit line aBL<2> through the (0, 2)-th read transistor RTr02. Another terminal of the (0, 2)-th program transistor PTr02 may be floated such that the (0, 2)-th program transistor PTr02 can function as a two-terminal element having a gate terminal and a source terminal. In other words, after a rupturing operation is performed on the (0, 2)-th program transistor PTr02, the (0, 2)-th read transistor RTr02 and the (0, 2)-th program transistor PTr02 may be coupled in series between the second antifuse bit line aBL<2> and the second program word line WLP<2>.

The (0, 0)-th antifuse cell Fuse_00d may be coupled to the 0-th antifuse sense amplifier 121_0d through the 0-th antifuse bit line aBL<0>. The 0-th antifuse sense amplifier 121_0d may receive an electrical signal from the (0, 0)-th read transistor RTr00 of the (0, 0)-th antifuse cell Fuse_00d through the 0-th antifuse bit line aBL<0>. The 0-th antifuse sense amplifier 121_0d may generate a voltage based on the received electrical signal, and compare the generated voltage and a reference voltage Vref, thereby detecting and outputting 0-th output data OutD0. The 0-th antifuse sense amplifier 121_0d may provide the 0-th output data OutD0 to a majority voting circuit 122.

The (0, 0)-th antifuse cell Fuse_00d may be coupled to a first antifuse sense amplifier 121_1d through the first antifuse bit line aBL<1>. The first antifuse sense amplifier 121_1d may receive an electrical signal from the (0, 1)-th read transistor RTr01 of the (0, 0)-th antifuse cell Fuse_00d through the first antifuse bit line aBL<1>. The first antifuse sense amplifier 121_1d may generate a voltage based on the received electrical signal, and compare the generated voltage and the reference voltage Vref, thereby detecting and outputting first output data OutD1. The first antifuse sense amplifier 121_1d may provide the first output data OutD1 to the majority voting circuit 122.

The (0, 0)-th antifuse cell Fuse_00d may be coupled to a second antifuse sense amplifier 121_2d through the second antifuse bit line aBL<2>. The second antifuse sense amplifier 121_2d may receive an electrical signal from the (0, 2)-th read transistor RTr02 of the (0, 0)-th antifuse cell Fuse_00d through the second antifuse bit line aBL<2>. The second antifuse sense amplifier 121_2d may generate a voltage based on the received electrical signal, and compare the generated voltage and the reference voltage Vref, thereby detecting and outputting second output data OutD2. The second antifuse sense amplifier 121_2d may provide the second output data OutD2 to the majority voting circuit 122.

The majority voting circuit 122 may be included in the antifuse sense amplifier 120 in FIG. 1. The majority voting circuit 122 may receive an odd number of output data which consist of at least three output data, and output fuse data FD corresponding to the majority of the received output data. The output data may be 0 or 1. In FIG. 16, it is shown that the majority voting circuit 122 receives three output data OutD0 to OutD2; however, the number of output data in FIG. 16 is merely an example, and the technical idea of the present disclosure is not limited thereto.

Figure 17:
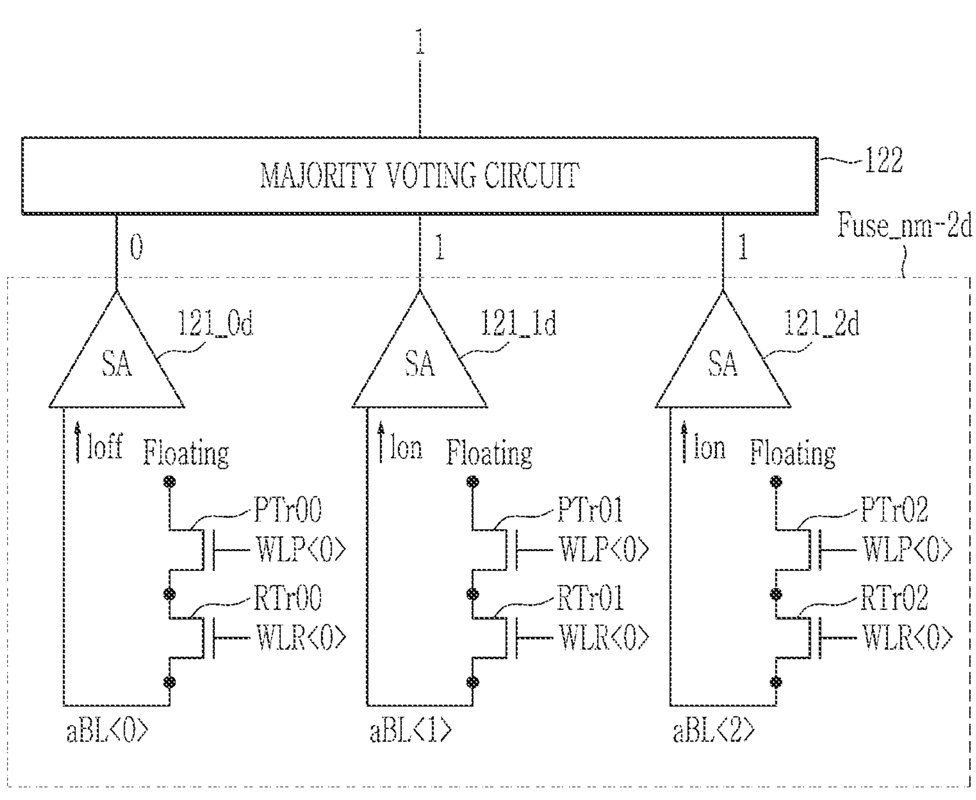
FIG. 17 is another example view for explaining the operation of a memory device.

FIG. 17 is another example view for explaining the operation of a memory device.

Referring to FIG. 16 and FIG. 17, after a programming or rupturing operation is performed on the (0, 0)-th antifuse cell Fuse_00d by the 0-th program word line WLP<0>, a read operation may be performed on the (0, 0)-th antifuse cell Fuse_00d by the 0-th program word line WLP<0> and the 0-th read word line WLR<0>.

Although a breakdown voltage is applied to the (0, 0)-th to (0, 2)-th program transistors PTr00 to PTr02, some of the (0, 0)-th to (0, 2)-th program transistors PTr00 to PTr02 may not be ruptured due to operation errors. Some program transistors that have not been ruptured may output off current Ioff during the read operation.

In some implementations, some of the (0, 0)-th to (0, 2)-th program transistors PTr00 to PTr02 may output program current Ion during the read operation, and the others of the (0, 0)-th to (0, 2)-th program transistors PTr00 to PTr02 may output off current Ioff.

For example, referring to FIG. 17, after the breakdown voltage is applied to the (0, 0)-th to (0, 2)-th program transistors PTr00 to PTr02 by the 0-th program word line WLP<0>, the (0, 0)-th program transistor PTr00 may not be ruptured, and the (0, 1)-th and (0, 2)-th program transistor PTr01 and PTr02 other than the (0, 0)-th program transistor PTr00 may be ruptured. Thereafter, during the read operation on the (0, 0)-th antifuse cell Fuse_00*d*, the (0, 0)-th program transistor PTr00 may output the off current Ioff, and the (0, 1)-th and (0, 2)-th program transistor PTr01 and PTr02 may output the program current Ion.

The (0, 0)-th read transistor RTr00 may provide the off current Ioff to the 0-th antifuse sense amplifier 121_0*d*. In some implementations, the 0-th antifuse sense amplifier 121_0*d* may output a value of 0 (a low-level signal) to the majority voting circuit 122 on the basis of the off current Ioff.

The (0, 1)-th read transistor RTr01 may provide the program current Ion to the first antifuse sense amplifier 121_1*d*. In some implementations, the first antifuse sense amplifier 121_1*d* may output a value of 1 (a high-level signal) to the majority voting circuit 122 on the basis of the program current Ion.

The (0, 2)-th read transistor RTr02 may provide the program current Ion to the second antifuse sense amplifier 121_2*d*. In some implementations, the second antifuse sense amplifier 121_2*d* may output a value of 1 (a high-level signal) to the majority voting circuit 122 on the basis of the program current Ion.

The majority voting circuit 122 may output a value of 1 as fuse data FD, on the basis of the values of 1 (the high-level signals) output from the first antifuse sense amplifier 121_1*d* and the second antifuse sense amplifier 121_2*d*.

The majority voting circuit 122 may normally output the fuse data FD of the (0, 0)-th antifuse cell Fuse_00*d* based on the program current Ion output from the (0, 1)-th and (0, 2)-th program transistor PTr01 and PTr02 other than the malfunctioned (0, 0)-th program transistor PTr00. In the present disclosure, the antifuse cell array 220*d* may be disposed in the memory cell region CS in FIG. 5, and the majority voting circuit 122 may be disposed in the peripheral circuit region PS in FIG. 6. Through the majority voting circuit 122, it is possible to improve the reliability of a read operation on the (0, 0)-th antifuse cell Fuse_00*d*.

Figure 18:
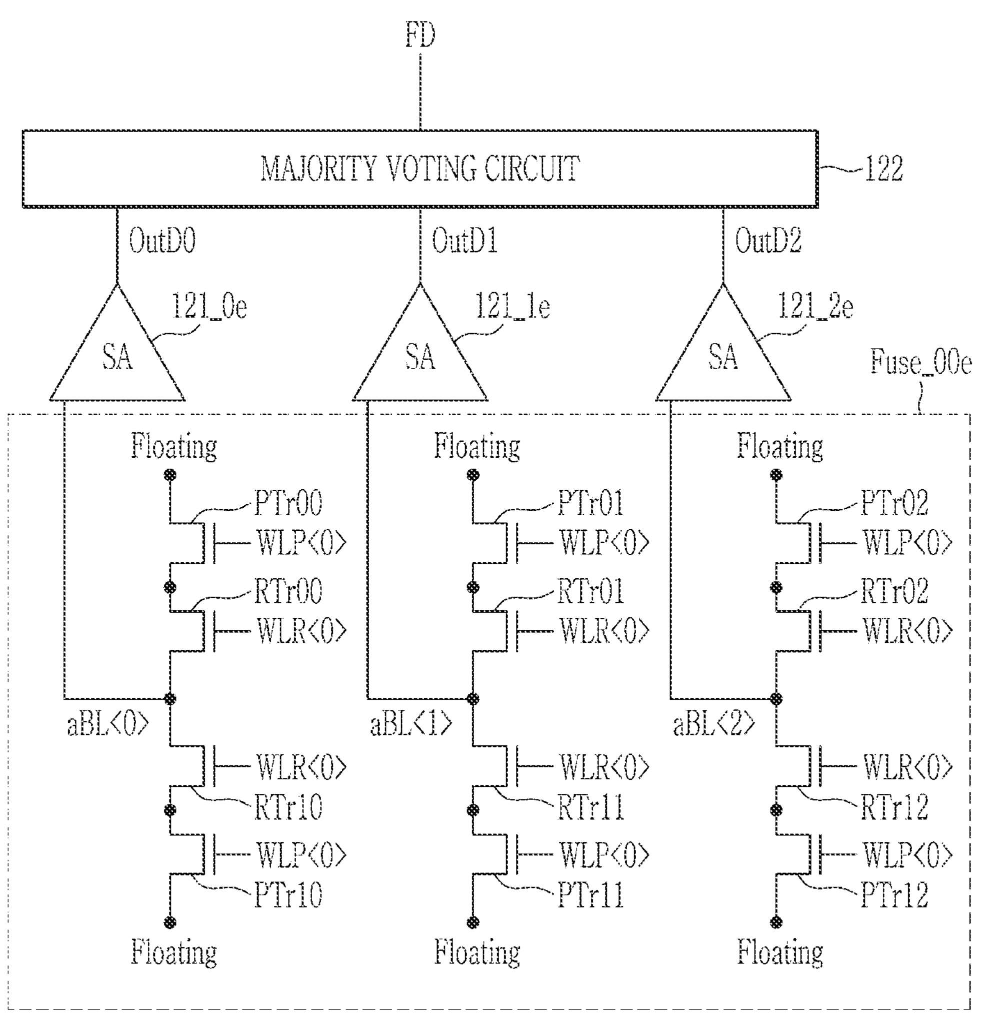
FIG. 18 is a circuit diagram illustrating another example of an antifuse cell.

FIG. 18 is a circuit diagram illustrating another example of an antifuse cell.

A (0, 0)-th antifuse cell Fuse_00*e* in FIG. 18 may correspond to the (0, 0)-th antifuse cell Fuse_00*d* in FIG. 16. For ease of explanation, the following description will be made with a focus on the differences between the (0, 0)-th antifuse cell Fuse_00*e* and the (0, 0)-th antifuse cell Fuse_00*d*.

Referring to FIG. 16 and FIG. 18 together, the (0, 0)-th antifuse cell Fuse_00*e* may further include (1, 0)-th to (1, 2)-th program transistors PTr10 to PTr12 and (1, 0)-th to (1, 2)-th read transistors RTr10 to RTr12, as compared to the (0, 0)-th antifuse cell Fuse_00*d* in FIG. 16.

The (1, 0)-th to (1, 2)-th read transistors RTr10 to RTr12 may correspond to the (0, 0)-th to (0, 2)-th read transistors RTr00 to RTr02 in FIG. 16, respectively. The (1, 0)-th to (1, 2)-th read transistors RTr10 to RTr12 may be operated by the 0-th read word line WLR<0>. One terminal of each of the (1, 0)-th to (1, 2)-th read transistors RTr10 to RTr12 may be coupled to a corresponding antifuse bit line of the 0-th to second antifuse bit lines aBL<0> to aBL<2>.

The (1, 0)-th to (1, 2)-th program transistors PTr10 to PTr12 may correspond to the (0, 0)-th to (0, 2)-th program transistors PTr00 to PTr02 in FIG. 16, respectively. The (1, 0)-th to (1, 2)-th program transistors PTr10 to PTr12 may be operated by the 0-th program word line WLP<0>. One terminal of each of the (1, 0)-th to (1, 2)-th program transistors PTr10 to PTr12 may be coupled to another terminal of a corresponding read transistor of the (1, 0)-th to (1, 2)-th read transistors RTr10 to RTr12.

Accordingly, after a rupturing operation is performed on the (0, 0)-th program transistor PTr00 and the (1, 0)-th program transistor PTr10, the (1, 0)-th program transistor PTr10 and the (1, 0)-th read transistor RTr10 may be coupled to the (0, 0)-th program transistor PTr00 and the (0, 0)-th read transistor RTr00 in parallel, between the 0-th antifuse bit line aBL<0> and the 0-th program word line WLP<0>. Similarly, after a rupturing operation is performed on the (0, 1)-th program transistor PTr01 and the (1, 1)-th program transistor PTr11, the (1, 1)-th program transistor PTr11 and the (1, 1)-th read transistor RTr11 may be coupled to the (0, 1)-th program transistor PTr01 and the (0, 1)-th read transistor RTr01 in parallel, between the first antifuse bit line aBL<1> and the 0-th program word line WLP<0>. After a rupturing operation is performed on the (0, 2)-th program transistor RTr02 and the (1, 2)-th program transistor PTr12, the (1, 2)-th program transistor PTr12 and the (1, 2)-th read transistor RTr12 may be coupled to the (0, 2)-th program transistor PTr02 and the (0, 2)-th read transistor RTr02 in parallel, between the second antifuse bit line aBL<2> and the 0-th program word line WLP<0>.

Figure 19:
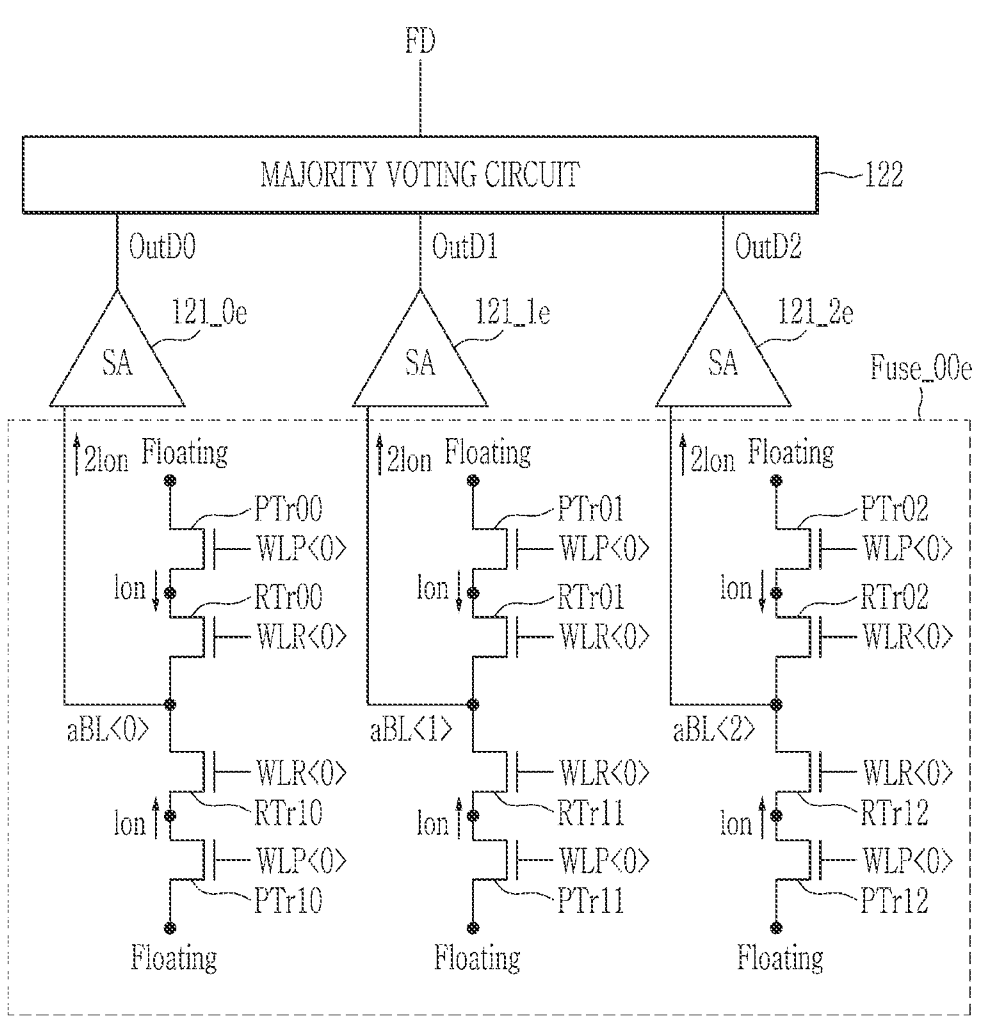
FIG. 19 is another example view for explaining the operation of a memory device.

FIG. 19 is another example view for explaining the operation of a memory device.

Referring to FIG. 18 and FIG. 19, after a programming or rupturing operation is performed on the (0, 0)-th antifuse cell Fuse_00*e* by the 0-th program word line WLP<0>, a read operation may be performed on the (0, 0)-th antifuse cell Fuse_00*e* by the 0-th program word line WLP<0> and the 0-th read word line WLR<0>.

When the read voltage is applied by the 0-th program word line WLP<0>, the (0, 0)-th to (0, 2)-th program transistors PTr00 to PTr02 and the (1, 0)-th to (1, 2)-th program transistors PTr10 to PTr12 may output program current Ion to the (0, 0)-th to (0, 2)-th read transistors RTr00 to RTr02 and the (1, 0)-th to (1, 2)-th read transistors RTr10 to RTr12, respectively.

The (0, 0)-th read transistor RTr00 and the (1, 0)-th read transistor RTr10 may provide the program current Ion output from the (0, 0)-th program transistor PTr00 and (1, 0)-th program transistor PTr10, to a 0-th antifuse sense amplifier 121_0*e*. The 0-th antifuse sense amplifier 121_0*e* may receive parallel program current 2Ion based on the program current Ion output from the (0, 0)-th read transistor RTr00 and the (1, 0)-th read transistor RTr10. The 0-th antifuse sense amplifier 121_0*e* may detect and output 0-th output data OutD0 based on the parallel program current 2Ion related to the (0, 0)-th read transistor RTr00 and the (1, 0)-th read transistor RTr10 during the read operation.

The (0, 1)-th read transistor RTr01 and the (1, 1)-th read transistor RTr11 may provide the program current Ion output from the (0, 1)-th program transistor PTr01 and the (1, 1)-th program transistor PTr11, to a first antifuse sense amplifier 121_1*e*. The first antifuse sense amplifier 121_1*e* may receive parallel program current 2Ion based on the program current Ion output from the (0, 1)-th read transistor RTr01 and the (1, 1)-th read transistor RTr11. The first antifuse sense amplifier 121_1*e* may detect and output first output data OutD1 based on the parallel program current 2Ion related to the (0, 1)-th read transistor RTr01 and the (1, 1)-th read transistor RTr11 during the read operation.

The (0, 2)-th read transistor RTr02 and the (1, 2)-th read transistor RTr12 may provide the program current Ion output from the (0, 2)-th program transistor PTr02 and the (1, 2)-th program transistor PTr12, to a second antifuse sense amplifier 121_2*e*. The second antifuse sense amplifier 121_2*e* may receive parallel program current 2Ion based on the program current Ion output from the (0, 2)-th read transistor RTr02 and the (1, 2)-th read transistor RTr12. The second antifuse sense amplifier 121_2*e* may detect and output second output data OutD2 based on the parallel program current 2Ion related to the (0, 2)-th read transistor RTr02 and the (1, 2)-th read transistor RTr12 during the read operation.

The 0-th to second antifuse sense amplifiers 121_0*e* to 121_2*e* may detect the 0-th to second output data OutD0 to OutD2 based on the parallel program current 2Ion through the parallel arrangement of the program transistors and the read transistors. Through the above-mentioned parallel arrangement, it is possible to improve the speed of a read operation on the (0, 0)-th antifuse cell Fuse_00*e*.

Figure 20:
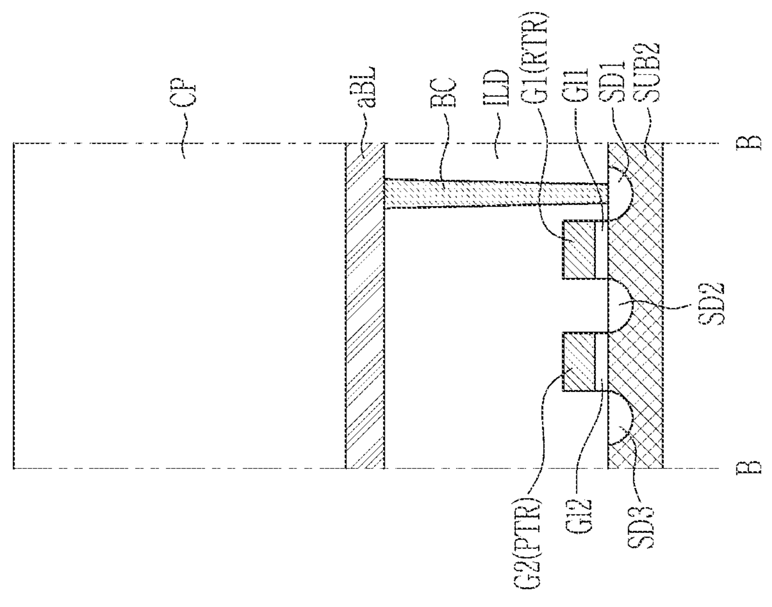
FIG. 20 is an example view for explaining a memory device.

FIG. 20 is an example view for explaining a memory device. FIG. 20 is cross-sectional views taken along line A-A and line B-B in FIG. 5. A memory device 10*f* in FIG. 20 and the memory device 10*a* in FIG. 7 may correspond to each other. For ease of explanation, the following description will be made with a focus on the differences between the memory device 10*f* and the memory device 10*a*.

An antifuse cell array 220 may include a second substrate SUB2, first gate electrodes G1, second gate electrodes G2, bit line contacts BC, and antifuse bit lines aBL.

In some implementations, the antifuse cell array 220 may include metal oxide semiconductor (MOS) transistors. Read transistors RTr and program transistors PTr may be implemented as metal oxide semiconductor (MOS) transistors. Each metal oxide semiconductor (MOS) transistor may include gate insulating layers G11 and G12 and gate electrodes G1 and G2 stacked on the second substrate SUB2, and source/drain regions SD1 to SD3 disposed adjacent to channel layers on both sides of its gate.

The first gate electrode G1 and the second gate electrode G2 may extend in the second direction D2, in parallel with the second substrate SUB2, on the second substrate SUB2. The first gate electrode G1 and the second gate electrode G2 may be disposed so as to extend in the second direction D2 and be spaced apart from each other in the first direction D1.

The first gate electrode G1 and the second gate electrode G2 may contain doped polysilicon, a metal, conductive metal nitride, conductive metal silicide, conductive metal oxide, or a combination thereof. For example, the first gate electrode G1 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof; but are not limited thereto.

In regions of the second substrate SUB2 that overlap the first gate electrode G1 and the second gate electrode G2 plane-wise along the third direction D3, the channel layers may be formed.

The source/drain regions SD1 to SD3 may be formed on both sides of the channel layers and between the channel layers. The source/drain regions SD1 to SD3 are doped impurity regions, and the first and second source/drain regions SD1 and SD2 may be formed both sides of the first gate electrode G1, and the second and third source/drain regions SD2 and SD3 may be formed on both sides of the second gate electrode G2. Between the first gate electrode G1 and the second gate electrode G2, the second source/drain region SD2 may be formed as one source/drain region.

Some portions of the first gate insulating layer G11 and the second gate insulating layer G12 may be interposed between the first gate electrode G1 and the second substrate SUB2 and between the second gate electrode G2 and the second substrate SUB2. For example, the first gate insulating layer G11 and the second gate insulating layer G12 may consist of silicon oxide films, silicon oxynitride films, high dielectric films having a dielectric constant larger than those of silicon oxide films, or a combination thereof. The high dielectric film may be formed of metal oxide or metal oxynitride. For example, high dielectric films that are usable as the first gate insulating layer G11 and the second gate insulating layer G12 may be formed of $HfO_2$, HfSiO, HfSiON, HfTaO, HfTiO, HfZrO, $ZrO_2$, $Al_2O_3$, or a combination thereof, but are not limited thereto.

On the area of the second substrate SUB2 between the first gate electrode G1 and the second gate electrode G2, an interlayer insulating layer ILD may be disposed.

The antifuse bit lines aBL may extend along the first direction D1 on the interlayer insulating layer ILD. An antifuse bit line aBL shown in FIG. 20 is one of the plurality of antifuse bit lines aBL. Although not shown in the drawing, in the memory device 10*f*, the plurality of antifuse bit lines aBL is disposed so as to be spaced apart from one another in the second direction D2. Capping patterns CP may be disposed on the antifuse bit line aBL and the interlayer insulating layer ILD so as to cover the antifuse cell array 220.

A bit line contact BC may extend in the third direction D3 while passing through the interlayer insulating layer ILD, so as to be in contact with the antifuse bit line aBL and the first source/drain region SD1.

The first source/drain region SD1, the first gate electrode G1, and the second source/drain region SD2 may function as the read transistor RTr in FIG. 3, and the second source/drain region SD2, the second gate electrode G2, and the third source/drain region SD3 may function as the program transistor PTr in FIG. 3. The second source/drain region SD2 may be the connection node of the read transistor RTr and the program transistor PTr in FIG. 3 and be a shared region.

A wiring structure and so on in the antifuse cell array may be disposed so as to be spaced apart from the third source/drain region SD3, such that the third source/drain region SD3 is in the floating state.

Figure 21:
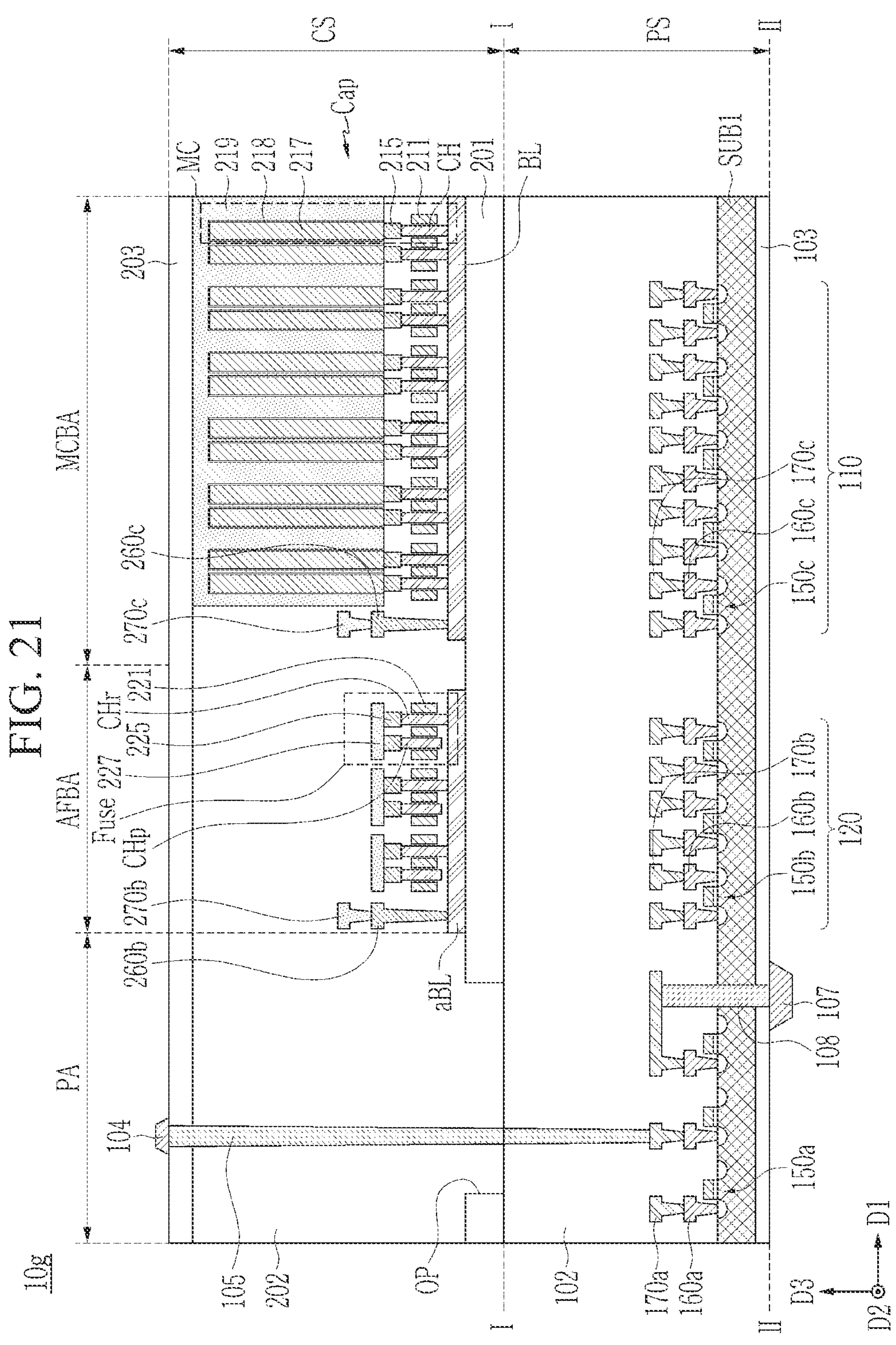
FIG. 21 is another example view for explaining a memory device.

FIG. 21 is another example view for explaining a memory device. FIG. 21 is a cross-sectional view taken along line C-C' in FIG. 4. For ease of explanation, the following description will be made with a focus on the differences between a memory device 10*g* in FIG. 21 and the memory device 10*a* in FIG. 8.

Referring to FIG. 8 and FIG. 21 together, as compared to the memory device 10*a* in FIG. 8, in the memory device 10*g*, the lower bonding metals 181*a* to 181*c* and 182*a* to 182*c* and the lower metal patterns 183*b* and 183*c* in the peripheral circuit region PS and the upper bonding metals 281*a* to 281*c* and 282*a* to 282*c* and the upper metal patterns 283*b* and 283*c* in the memory cell region CS are not disposed.

Further, between second metal layers 170*a*, 170*b*, and 170*c* of the peripheral circuit region PS and second metal layers 270*b* and 270*c* of the memory cell region CS, antifuse bit lines aBL, bit lines BL, and antifuse cells (Fuse) may be disposed.

Accordingly, the second metal layers 270*b* and 270*c* of the memory cell region CS may be disposed above the antifuse bit lines aBL, the bit lines BL, and the antifuse cells (Fuse) in the third direction D3.

As compared to the memory device 10*a* in FIG. 8, the memory device 10*g* may include a horizontal semiconductor layer 201 that is disposed below the antifuse bit lines aBL and the bit lines BL, in place of the second substrate SUB2 disposed on the antifuse bit lines aBL and the bit lines BL The horizontal semiconductor layer 201 may include a lower support semiconductor layer, and a common source plate on the lower support semiconductor layer. The horizontal semiconductor layer 201 may contain, for example, at least one of silicon (Si), germanium (Ge), silicon germanium (SiGe), gallium arsenide (GaAs), indium gallium arsenide (InGaAs), aluminum gallium arsenide (AlGaAs), or a mixture thereof. The horizontal semiconductor layer 201 may have a crystalline structure including at least one selected from monocrystalline, amorphous, and polycrystalline structures.

In some implementations, the horizontal semiconductor layer 201 may have openings OP. In some implementations, a first interlayer insulating layer 102 and a second interlayer insulating layer 202 may be in contact with each other through the openings OP. Second external contact plugs 105 may extend in the third direction D3 through the openings OP and pass through some portions of the second interlayer insulating layer 202 and the first interlayer insulating layer 102, thereby being electrically coupled to the second metal layers 170*c* of the external pad bonding area PA. In some implementations, the second external contact plugs 105 may be electrically coupled to circuit elements 150*a* in the external pad bonding area PA.

Further, an upper insulating layer 203 may be disposed above the second metal layers 260*b* and 260*c* so as to cover the second metal layers 260*b* and 260*c* and the second interlayer insulating layer 202.

In FIG. 21, the second metal layers 170*a*, 170*b*, and 170*c* of the peripheral circuit region PS and the second metal layers 270*b* and 270*c* of the memory cell region CS are not coupled to each other; however, the second metal layers 170*a*, 170*b*, and 170*c* of the peripheral circuit region PS may be electrically coupled to the second metal layers 270*b* and 270*c* of the memory cell region CS, respectively.

Accordingly, although not shown in the drawing, the circuit elements 150*b* of the antifuse sense amplifier 120 may be electrically coupled to the plurality of antifuse bit lines aBL through the first and second metal layers 160*b* and 170*b* of the peripheral circuit region PS and the first and second metal layers 260*b* and 270*b* of the memory cell region CS.

Similarly, the circuit elements 150*c* of the sense amplifier 110 may be electrically coupled to the bit lines BL through the first and second metal layers 160*c* and 170*c* of the peripheral circuit region PS and the first and second metal layers 260*c* and 270*c* of the memory cell region CS.

Figure 22:
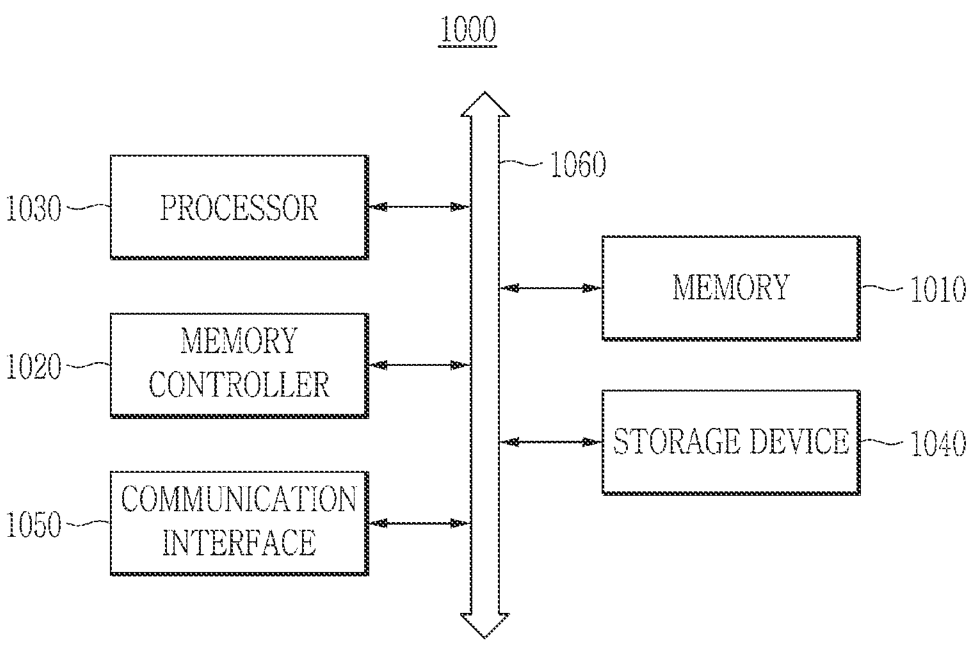
FIG. 22 is a block diagram illustrating an example of a computing device.

FIG. 22 is a block diagram illustrating an example of a computing device.

Referring to FIG. 22, a computing device 1000 includes a processor 1030, a memory 1010, a memory controller 1020, a storage device 1040, a communication interface 1050, and a bus 1060. Although not shown in the drawing, the computing device 1000 may further include other general-purpose components.

The processor 1030 controls the overall operation of each component of the computing device 1000. The processor 1030 may be implemented with at least one of various processing units such as CPUs (Central Processing Units), APs (application processors), GPUs (graphic processing units), etc.

The memory 1010 stores a variety of data and commands. The memory 1010 may be implemented with the memory devices described with reference to FIG. 1 to FIG. 21. The memory device may have a COP structure form, and an antifuse cell array for storing fuse information may be disposed in a memory cell region.

The memory controller 1020 controls transfer of data or commands to the memory 1010 and from the memory 1010. In some implementations, the memory controller 1020 may be provided as a separate chip from the processor 1030. In some implementations, the memory controller 1020 may be provided as an internal component of the processor 1030.

The storage device 1040 stores programs and data in a non-volatile way. In some implementations, the storage device 1040 may be implemented with non-volatile memories. The communication interface 1050 supports wired/wireless Internet communication of the computing device 1000. Further, the communication interface 1050 may support various communication systems besides Internet communication. The bus 1060 provides a communication function between the constituent elements of the computing device 1000. The bus 1060 may include at least one type of bus according to the communication protocols between the constituent elements.

While this specification contains many specific implementation details, these should not be construed as limitations on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

While this disclosure has been described in connection with what is presently considered to be practical implementations, it is to be understood that the disclosure is not limited to the disclosed implementations. On the contrary, it is intended to cover various modifications and equivalent arrangements included within the spirit and scope of the appended claims.

What is claimed is:

1. A memory device comprising:

a memory cell region, the memory cell region including:
a memory cell array that is configured to store data, and
an antifuse cell array that includes an antifuse cell; and a peripheral circuit region, wherein at least a portion of the peripheral circuit region overlaps the memory cell region in a plan view, the peripheral circuit region is stacked with the memory cell region in a vertical direction, and the peripheral circuit region includes an antifuse sense amplifier that is configured to output one-time programmable (OTP) data stored in the antifuse cell.

2. The memory device of claim 1, wherein the OTP data stored in the antifuse cell corresponds to one bit, and the antifuse cell includes at least three transistors.

3. The memory device of claim 2, wherein the antifuse cell array includes a plurality of program word lines, and the antifuse cell includes at least two program transistors that are operated by a program word line of the plurality of program word lines.

4. The memory device of claim 2, wherein the antifuse cell array includes a plurality of antifuse bit lines, the plurality of antifuse bit lines including a first antifuse bit line, a second antifuse bit line, and a third antifuse bit line, the antifuse sense amplifier includes a first antifuse sense amplifier that is configured to output first output data based on a signal input from the first antifuse bit line, a second antifuse sense amplifier that is configured to output second output data based on a signal input from the second antifuse bit line, and a third antifuse sense amplifier that is configured to output third output data based on a signal input from the third antifuse bit line, and the peripheral circuit region includes a majority voting circuit that is configured to receive the first output data, the second output data, and the third output data.

5. The memory device of claim 4, wherein the majority voting circuit is configured to output, as the OTP data, data corresponding to a majority of the first output data, the second output data, and the third output data.

6. The memory device of claim 1, wherein the antifuse sense amplifier overlaps at least a portion of the antifuse cell array in a planar manner.

7. The memory device of claim 1, wherein the peripheral circuit region includes a substrate, and the antifuse cell includes a vertical-channel layer that extends in a vertical direction of the substrate.

8. The memory device of claim 7, wherein the vertical-channel layer contains at least one of silicon or Indium Gallium Zinc Oxide (IGZO).

* * * * *